US011139367B2

(12) United States Patent
Takahashi et al.

(10) Patent No.: US 11,139,367 B2
(45) Date of Patent: Oct. 5, 2021

(54) HIGH DENSITY MIM CAPACITOR STRUCTURE

(71) Applicant: Taiwan Semiconductor Manufacturing Co., Ltd., Hsin-Chu (TW)

(72) Inventors: Seiji Takahashi, Hsinchu (TW); Chen-Jong Wang, Hsin-Chu (TW); Dun-Nian Yaung, Taipei (TW); Jung-I Lin, Hsinchu (TW); Jhy-Jyi Sze, Hsin-Chu (TW); Alexander Kalnitsky, San Francisco, CA (US); Yimin Huang, Hsinchu (TW); King Liao, Tainan (TW); Shen-Hui Hong, Tainan (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/365,904

(22) Filed: Mar. 27, 2019

(65) Prior Publication Data

US 2020/0135844 A1    Apr. 30, 2020

Related U.S. Application Data

(60) Provisional application No. 62/752,628, filed on Oct. 30, 2018.

(51) Int. Cl.
*H01L 49/02* (2006.01)
*H01L 21/768* (2006.01)

(52) U.S. Cl.
CPC ........ *H01L 28/75* (2013.01); *H01L 21/76834* (2013.01); *H01L 21/76849* (2013.01)

(58) Field of Classification Search
CPC ........ H01L 27/224; H01L 28/86; H01L 28/90
See application file for complete search history.

(56) References Cited

U.S. PATENT DOCUMENTS

| 9,312,327 B2 | 4/2016 | Ozawa et al. |
| 9,324,780 B2 | 4/2016 | Jen et al. |
| 2003/0183862 A1 | 10/2003 | Jin et al. |
| 2005/0258512 A1* | 11/2005 | Tu ............... H01L 27/10894 257/534 |
| 2006/0234464 A1* | 10/2006 | Giraudin ......... H01L 21/76895 438/386 |

(Continued)

FOREIGN PATENT DOCUMENTS

KR    20030001645 A    1/2003

*Primary Examiner* — Daniel Whalen
(74) *Attorney, Agent, or Firm* — Eschweiler & Potashnik, LLC

(57) ABSTRACT

The present disclosure, in some embodiments, relates to an integrated chip. The integrated chip includes a dielectric structure disposed over a substrate. A plurality of conductive interconnect layers are disposed within the dielectric structure. The plurality of conductive interconnect layers include alternating layers of interconnect wires and interconnect vias. A metal-insulating-metal (MIM) capacitor is arranged within the dielectric structure. The MIM capacitor has a lower conductive electrode separated from an upper conductive electrode by a capacitor dielectric structure. The MIM capacitor vertically extends past two or more of the plurality of conductive interconnect layers.

20 Claims, 21 Drawing Sheets

(56) References Cited

U.S. PATENT DOCUMENTS

| | | |
|---|---|---|
| 2011/0284991 A1 | 11/2011 | Hijioka et al. |
| 2012/0193760 A1 | 8/2012 | Manabe et al. |
| 2012/0223413 A1 | 9/2012 | Lindert |
| 2012/0235274 A1 | 9/2012 | Doyle et al. |
| 2012/0326274 A1 | 12/2012 | Doyle et al. |
| 2013/0270676 A1 | 10/2013 | Lindert et al. |
| 2013/0271938 A1* | 10/2013 | Lindert ............. H01L 27/10814 361/782 |
| 2016/0020270 A1* | 1/2016 | Kim .................... H01L 23/5223 257/296 |
| 2017/0148868 A1 | 5/2017 | Lindert et al. |

* cited by examiner

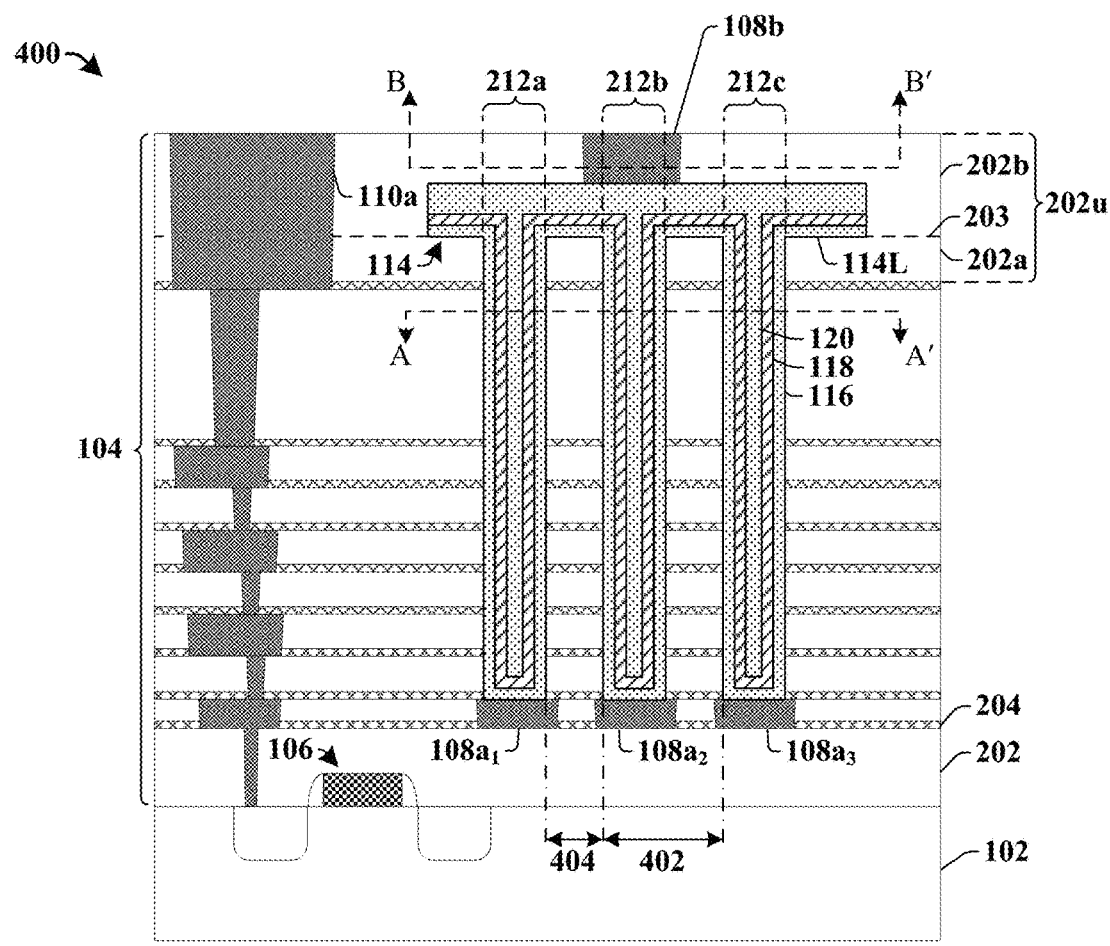
Fig. 4A
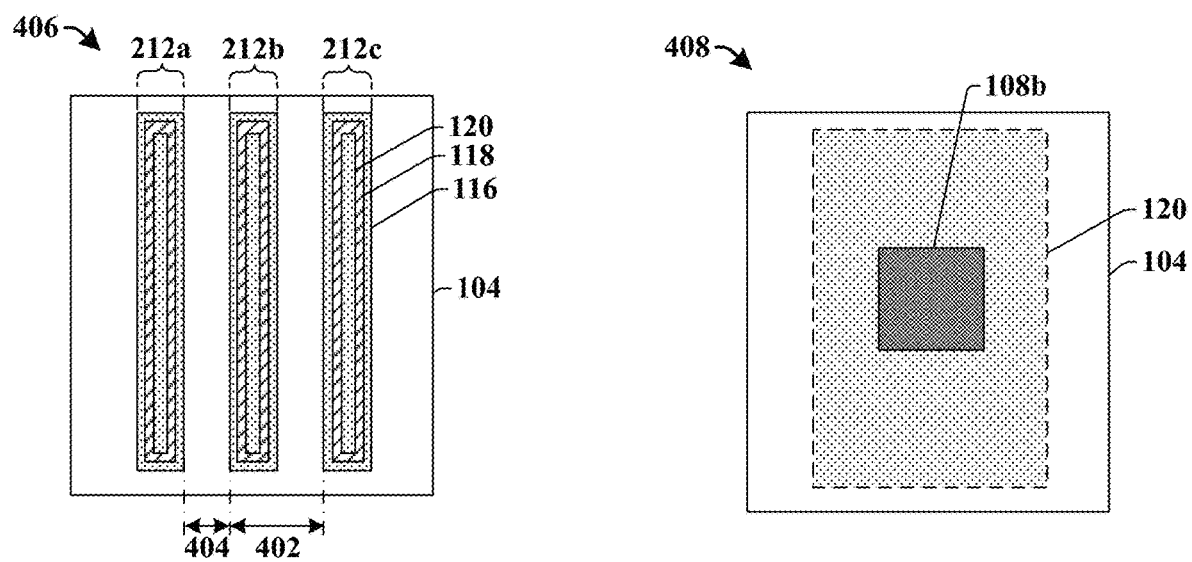
Fig. 4B
Fig. 4C

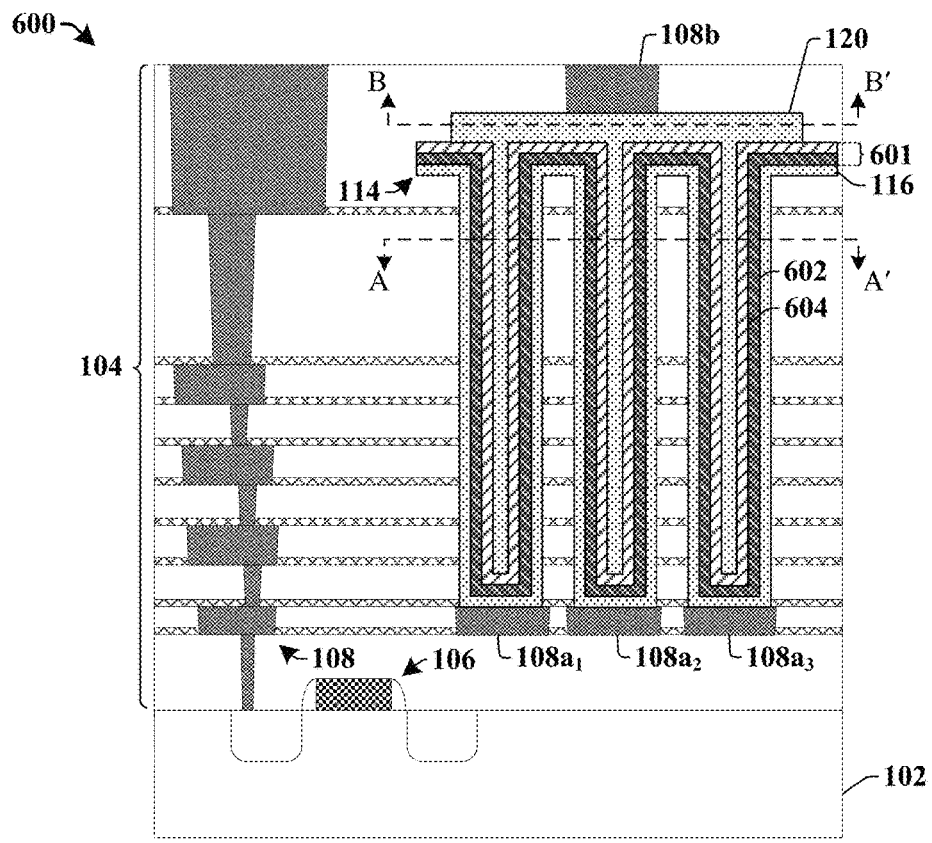
Fig. 6A
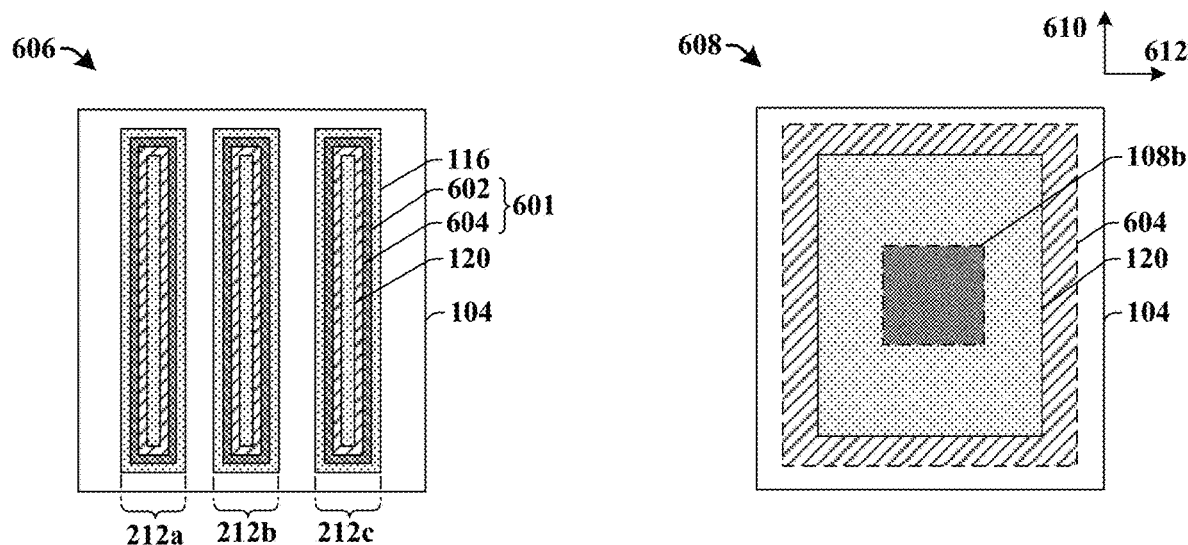
Fig. 6B
Fig. 6C

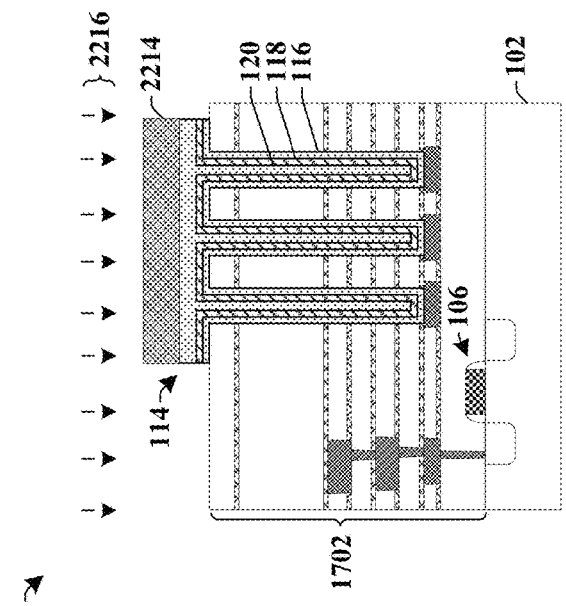
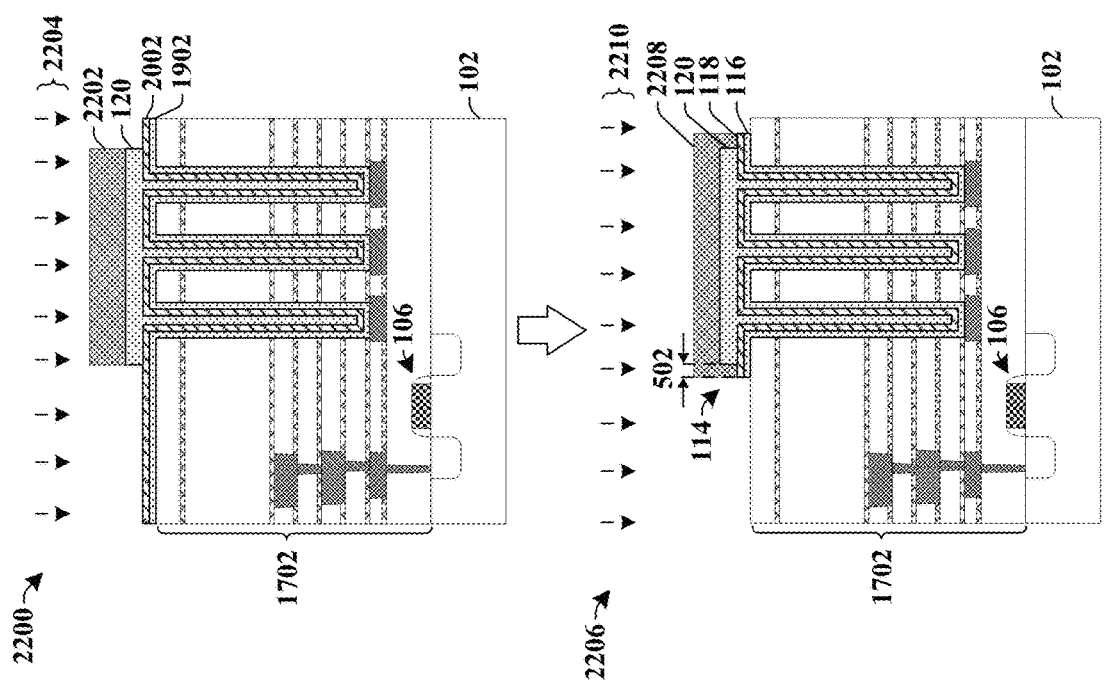
Fig. 22A
Fig. 22B

HIGH DENSITY MIM CAPACITOR STRUCTURE

REFERENCE TO RELATED APPLICATION

This Application claims the benefit of U.S. Provisional Application No. 62/752,628, filed on Oct. 30, 2018, the contents of which are hereby incorporated by reference in their entirety.

BACKGROUND

Integrated chips are formed on semiconductor die comprising millions or billions of transistor devices. The transistor devices are configured to act as switches and/or to produce power gains so as to enable logical functionality for an integrated chip (e.g., form a processor configured to perform logic functions). Integrated chips also comprise passive devices, such as capacitors, resistors, inductors, varactors, etc. Passive devices are widely used to control integrated chip characteristics, such as gains, time constants, etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-4C illustrate some additional embodiments of an integrated chip having a high density MIM capacitor.

FIGS. 6A-6C illustrate some additional embodiments of an integrated chip having a high density MIM capacitor comprising a multi-film capacitor dielectric structure.

FIGS. 16-25 illustrate cross-sectional views of some embodiments of a method of forming an integrated chip having a high density MIM capacitor that vertically extends over a plurality of conductive interconnect layers.

DETAILED DESCRIPTION

Figure 1:
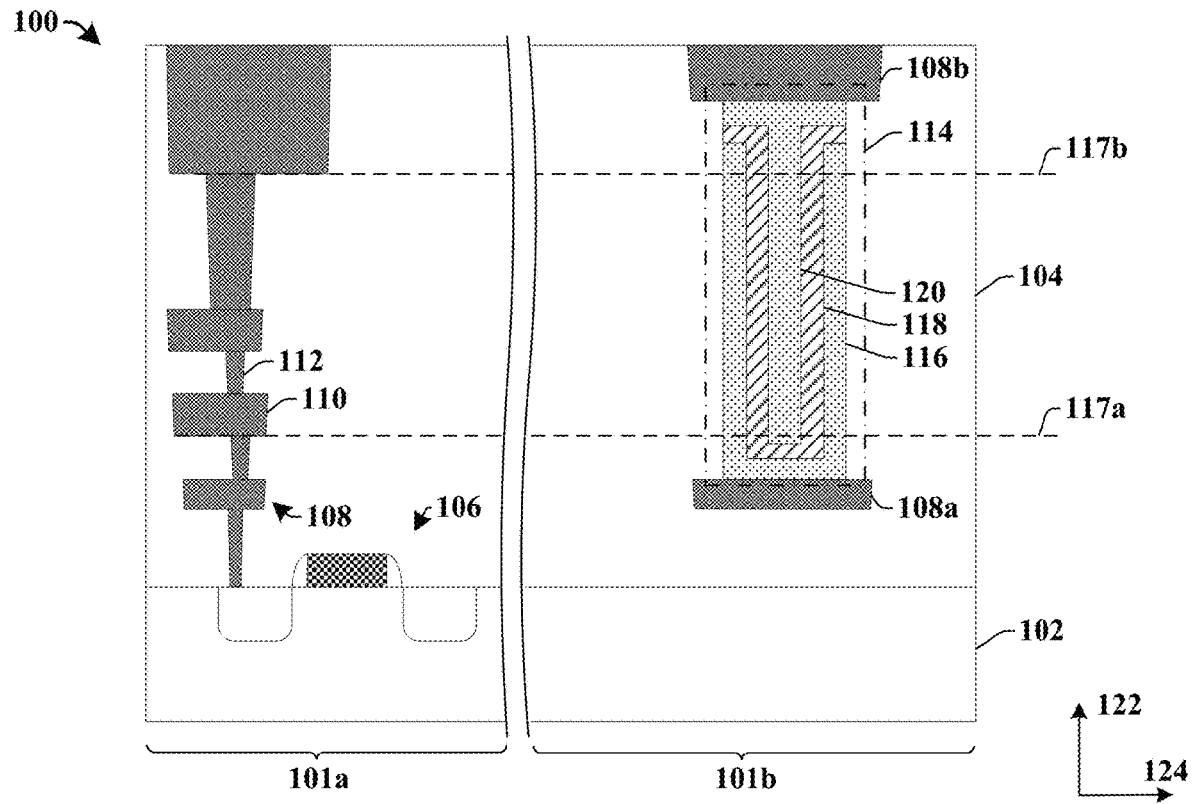
FIG. 1 illustrates a cross-sectional view of some embodiments of an integrated chip having a high density MIM (metal-insulator-metal) capacitor that vertically extends over a plurality of conductive interconnect layers.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

MIM (metal-insulator-metal) capacitors typically comprise a capacitor dielectric layer arranged between an upper conductive electrode and a lower conductive electrode. The upper conductive electrode and the lower conductive electrode are often disposed within an inter-level dielectric (ILD) layer on a back-end-of-the-line (BEOL) of an integrated chip. To achieve a sufficiently high capacitance for integrated chip applications, MIM capacitors often consume a relatively large area of an integrated chip. For example, a MIM capacitor may have an area that is on the order of 10 microns$^2$.

While the minimum feature sizes of integrated chips (e.g., gate sizes, metal interconnect sizes, etc.) continue to decrease, MIM capacitors are unable to similarly scale their size without decreasing their capacitance. This is because the capacitance of a MIM capacitor is directly proportional to an area of the upper conductive electrode and the lower conductive electrode. Therefore, as the minimum features sizes of integrated chips decrease MIM capacitors are consuming proportionally larger areas of a substrate to achieve a same capacitance, and thus are becoming increasingly expensive.

The present disclosure, in some embodiments, relates to an integrated chip comprising a MIM (metal-insulator-metal) capacitor having a relatively large capacitance while consuming a relatively small area of a substrate. In some embodiments, the integrated chip includes a plurality of conductive interconnect layers (e.g., interconnect wires and/or interconnect vias) disposed within a dielectric structure over a substrate. A metal-insulating-metal (MIM) capacitor is also arranged within the dielectric structure. The MIM capacitor includes a lower conductive electrode separated from an upper conductive electrode by a capacitor dielectric structure. The lower conductive electrode and the upper conductive electrode vertically extend past two or more of the plurality of interconnect layers. By vertically extending past two or more of the plurality of interconnect layers, the lower and upper conductive electrodes can have relatively large surfaces areas that allow the MIM capacitor to achieve a relatively large capacitance while consuming a relatively small area of the substrate.

FIG. 1 illustrates a cross-sectional view of some embodiments of an integrated chip 100 having a high density MIM (metal-insulator-metal) capacitor that vertically extends over a plurality of conductive interconnect layers.

The integrated chip 100 comprises a transistor device 106 arranged over a substrate 102. A dielectric structure 104 is also arranged over the substrate 102 and surrounds the transistor device 106. The dielectric structure 104 further surrounds a plurality of conductive interconnect layers 108, which are electrically coupled to the transistor device 106. In some embodiments, the dielectric structure 104 comprises a plurality of stacked inter-level dielectric (ILD) layers. In some embodiments, the plurality of conductive interconnect layers 108 comprise alternating layers of interconnect wires 110 and interconnect vias 112.

A MIM capacitor 114 is arranged within the dielectric structure 104 between a lower interconnect layer 108a and an upper interconnect layer 108b. In some embodiments, the transistor device 106 may be arranged within a logic region 101a of the substrate 102, while the MIM capacitor 114 may comprise a decoupling capacitor (e.g., a capacitor configured to decouple one part of an electrical circuit from another) arranged within a decoupling region 101b separate from the logic region 101a. In other embodiments, the MIM capacitor 114 may configured to perform other functions.

The MIM capacitor 114 includes a lower conductive electrode 116 that is separated from an upper conductive electrode 120 by a capacitor dielectric structure 118 having one or more dielectric layers. In some embodiments, the capacitor dielectric structure 118 separates the lower conductive electrode 116 from the upper conductive electrode 120 along a first direction 122 and along a second direction 124 that is perpendicular to the first direction 122. The capacitor dielectric structure 118 is configured to separate the lower conductive electrode 116 from the upper conductive electrode 120, so that the MIM capacitor 114 is able to store energy in an electric field generated between the lower conductive electrode 116 and the upper conductive electrode 120.

The MIM capacitor 114 is laterally separated from two or more of the plurality of conductive interconnect layers 108 (e.g., from two or more interconnect wires 110 and/or interconnect vias 112) by the dielectric structure 104. In some embodiments, a horizontal plane, 117a or 117b, which is parallel to an upper surface of the substrate 102 extends along a top or a bottom of one of the plurality of conductive interconnect layers 108 and through a sidewall of the MIM capacitor 114. In some embodiments, the MIM capacitor 114 may vertically extend (i.e., in a direction that is perpendicular to an underlying upper surface of the substrate 102) past two or more of the plurality of conductive interconnect layers 108. By extending past two or more of the plurality of conductive interconnect layers 108, the lower conductive electrode 116 and the upper conductive electrode 120 are able to achieve relatively large surface areas. Because the capacitance of the MIM capacitor 114 is proportional to surface areas of the lower conductive electrode 116 and the upper conductive electrode, the large surface areas of the lower conductive electrode 116 and the upper conductive electrode 120 allow the MIM capacitor 114 to have a relatively large capacitance over a relatively small surface area of the substrate 102.

Figure 2A:
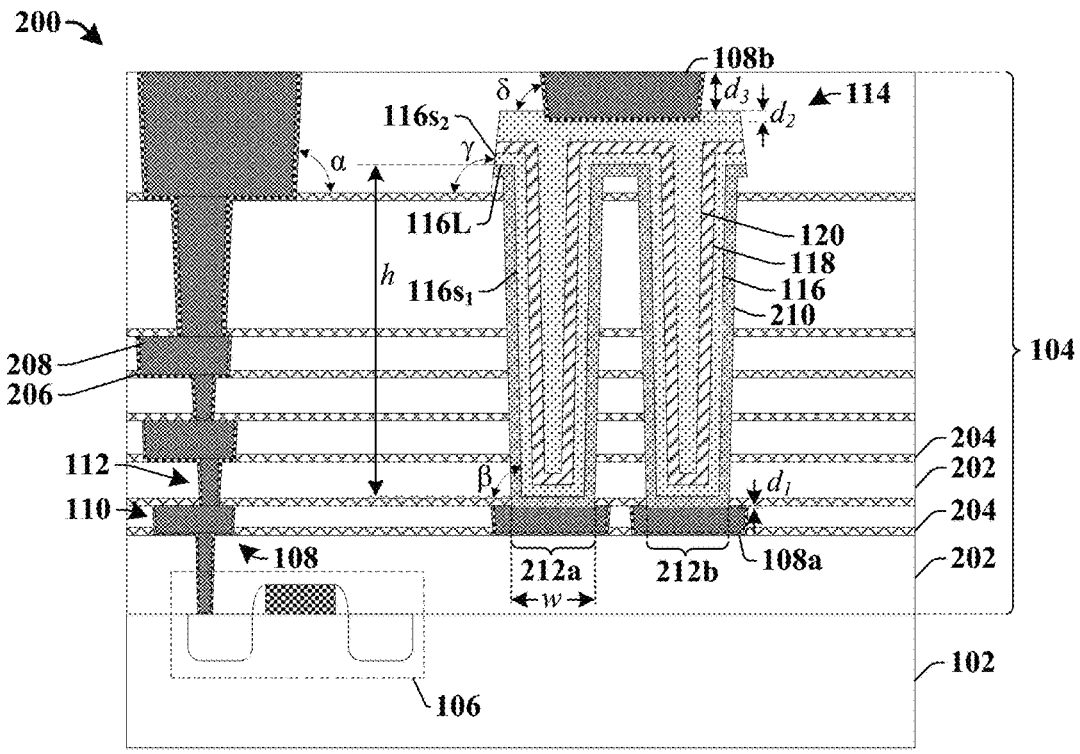
FIGS. 2A-2B illustrate some additional embodiments of an integrated chip having a high density MIM capacitor.

FIG. 2A illustrates a cross-sectional view of some additional embodiments of an integrated chip 200 having a high density MIM capacitor.

The integrated chip 200 comprises a dielectric structure 104 disposed over a substrate 102. The dielectric structure 104 comprises a plurality of stacked inter-level dielectric (ILD) layers 202 separated by a plurality of etch stop layers 204. In some embodiments, the plurality of stacked ILD layers 202 may comprise one or more of silicon dioxide, doped silicon dioxide (e.g., carbon doped silicon dioxide), silicon oxynitride, borosilicate glass (BSG), phosphoric silicate glass (PSG), borophosphosilicate glass (BPSG), fluorinated silicate glass (FSG), or the like. In some embodiments, the plurality of etch stop layers 204 may comprise silicon carbide, silicon nitride, titanium nitride, tantalum nitride, or the like.

A plurality of conductive interconnect layers 108 are arranged within the dielectric structure 104. The plurality of conductive interconnect layers 108 comprise alternating layers of interconnect wires 110 and interconnect vias 112 respectively surrounded by one of the plurality of ILD layers 202. For example, a first interconnect wire may be surrounded by a first ILD layer, a second interconnect wire may be surrounded by a second ILD layer, etc. In some embodiments, the interconnect wires 110 and the interconnect vias 112 respectively comprise a diffusion barrier layer 206 surrounding a metal core 208. In some embodiments, the diffusion barrier layer 206 may comprise tantalum, titanium nitride, or the like. In some embodiments, the metal core 208 may comprise copper, tungsten, aluminum, or the like. In some embodiments, one of the plurality of conductive interconnect layers 108 may have a sidewall that is oriented at a first angle $\alpha$ with respect to a bottom of a surrounding ILD layer 202. In some embodiments, the first angle $\alpha$ may be an acute angle. For example, in some embodiments, the first angle $\alpha$ may be in a range of between 80° and 90°.

A MIM capacitor 114 is also arranged within the dielectric structure 104 between a lower interconnect layer 108a and an upper interconnect layer 108b. The MIM capacitor 114 includes a lower conductive electrode 116 that is separated from an upper conductive electrode 120 by a capacitor dielectric structure 118. In some embodiments, the lower conductive electrode 116 has a top surface that is below the capacitor dielectric structure 118, and the capacitor dielectric structure 118 has a top surface that is below the upper conductive electrode 120. In some embodiments, the lower interconnect layer 108a and the upper interconnect layer 108b may comprise a metal (e.g., copper, tungsten, aluminum, or the like). In some embodiments, the lower conductive electrode 116 and the upper conductive electrode 120 may comprise a metal that is different than that of the lower interconnect layer 108a and/or the upper interconnect layer 108b. In some embodiments, the capacitor dielectric structure 118 may comprise a high-k dielectric material. In some embodiments, a barrier layer 210 (e.g., titanium, titanium nitride, or the like) may separate the lower conductive electrode 116 from the dielectric structure 104. In other embodiments, the barrier layer 210 may be omitted.

In some embodiments, the lower conductive electrode 116 may extend below a top surface of the lower interconnect layer 108a by a first distance $d_1$. In some embodiments, the upper interconnect layer 108b may extend below a top surface of the upper conductive electrode 120 by a second distance $d_2$. In some embodiments, the second distance $d_2$ may be larger than the first distance $d_1$. In some embodiments, a top surface of the MIM capacitor 114 (e.g., a top surface of the upper conductive electrode 120) may be a third distance $d_3$ below a top surface of a surrounding ILD layer 202. In some embodiments, the upper interconnect layer 108b may have outermost sidewalls that contact inner sidewalls of the upper conductive electrode 120. In other embodiments (not shown), the upper interconnect layer 108b may laterally extend past outermost sidewalls of the upper conductive electrode 120. In such embodiments, interior sidewalls of the upper interconnect layer 108b may contact outermost sidewalls of the upper conductive electrode 120.

In some embodiments, the MIM capacitor 114 may include one or more protrusions 212a-212b extending outward from a lower surface of the MIM capacitor 114. In some embodiments, the one or more protrusions 212a-212b may respectively have a height h and a width w. In some embodiments, a ratio of the height h to the width w may be in a range of between approximately 1 and approximately 50 (e.g., 1<h/w<50). In some additional embodiments, a ratio of the height h to the width w may be in a range of between approximately 20 and approximately 50 (e.g., 20<h/w<50). Such high ratios of the height h to the width w provide the MIM capacitor 114 with a relatively high capacitance over a small surface area of the substrate 102.

Figure 2B:
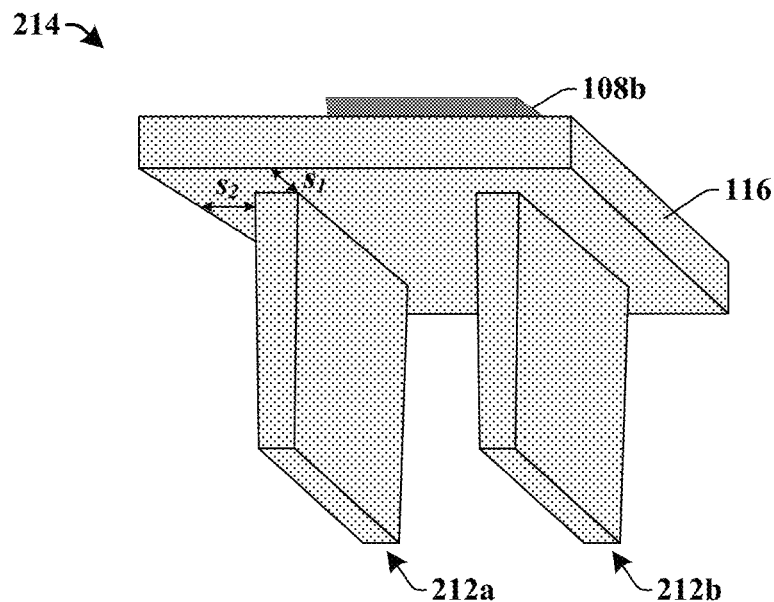

In some embodiments, shown in three-dimensional view 214 of FIG. 2B, the one or more protrusions 212a-212b may be set back from outermost sidewalls of the lower conductive electrode 116 by non-zero distances. For example, in some embodiments, a first protrusion 212a may be set-back from a first outer sidewall of the lower conductive electrode 116 by a first set-back $s_1$ and from a second outer sidewall of the lower conductive electrode 116 by a second set-back $s_2$.

The one or more protrusions 212a-212b are respectively defined by a lower sidewall $116s_1$ that extends outward from a lower surface 116L of the lower conductive electrode 116 to a bottom of the lower conductive electrode 116. In some embodiments, the lower surface 116L of the lower conductive electrode 116 is separated from a closest underlying etch stop layer 204 by an ILD layer 202. In some embodiments, the lower sidewall $116s_1$ of the lower conductive electrode 116 may be oriented at a second angle β with respect to a bottom of a surrounding ILD layer 202. In some embodiments, the second angle β may be smaller than the first angle α. For example, in some embodiments, the second angle β may be an acute angle that is in a range of between approximately 70° and approximately 90°. In some embodiments, the lower conductive electrode 116 may further comprise an upper sidewall $116s_2$ that is over the lower surface 116L. The upper sidewall $116s_2$ may be oriented at a third angle γ with respect to a bottom of a surrounding ILD layer 202. In some embodiments, the third angle γ may be an obtuse angle. For example, in some embodiments the third angle γ may be in a range of between approximately 90° and approximately 120°. In some embodiments, the upper interconnect layer 108b may comprise a sidewall that is oriented at a fourth angle δ with respect to a top of the upper conductive electrode 120. In some embodiments, the fourth angle δ may be an acute angle that is in a range of between 80° and 90°. In some embodiments, the first angle α may be substantially equal to the fourth angle δ.

Figure 3:
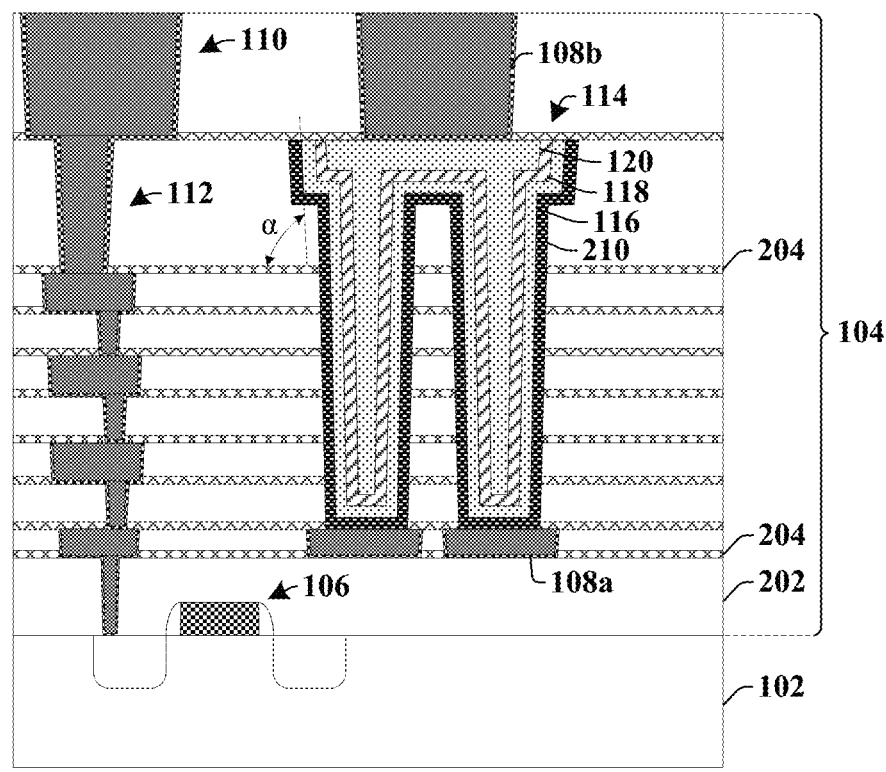
FIG. 3 illustrates a cross-sectional view of some additional embodiments of an integrated chip having a high density MIM capacitor.

FIG. 3 illustrates a cross-sectional view of some additional embodiments of an integrated chip 300 having a high density MIM capacitor that vertically extends over a plurality of conductive interconnect layers.

The integrated chip 300 comprises a MIM capacitor 114 arranged within a dielectric structure 104 over a substrate 102. The MIM capacitor 114 has a lower conductive electrode 116 that is separated from an upper conductive electrode 120 by a capacitor dielectric structure 118. In some embodiments, the lower conductive electrode 116 laterally separates outermost sidewalls of the capacitor dielectric structure 118 from the dielectric structure 104, and the capacitor dielectric structure 118 laterally separates outermost sidewalls of the upper conductive electrode 120 from the dielectric structure 104. In some such embodiments, the outermost sidewalls of the lower conductive electrode 116 may be oriented at an angle α with respect to a bottom of a surrounding ILD layer 202. The angle α may be an acute angle (e.g., in a range of between approximately 70° and approximately 90°). In some embodiments, top surfaces of the lower conductive electrode 116, the capacitor dielectric structure 118, and the upper conductive electrode 120 directly contact an etch stop layer 204 over the MIM capacitor 114.

FIGS. 4A-4C illustrate some additional embodiments of an integrated chip having a high density MIM capacitor. FIG. 4A illustrates a cross-sectional view 400 of the integrated chip. FIG. 4B illustrates a top-view 406 of the integrated chip along cross-sectional line A-A' of cross-sectional view 400. FIG. 4C illustrates a top-view 408 of the integrated chip along cross-sectional line B-B' of cross-sectional view 400.

As shown in cross-sectional view 400, the integrated chip comprises a MIM capacitor 114 arranged within a dielectric structure 104 over a substrate 102 and having a lower conductive electrode 116 that is separated from an upper conductive electrode 120 by a capacitor dielectric structure 118. In some embodiments, the MIM capacitor 114 may extend to an upper ILD layer 202u. The upper ILD layer 202u may comprise a first ILD layer 202a contacting a second ILD layer 202b along a seam 203 that runs along a lower surface 114L of the MIM capacitor 114 and that intersects a sidewall of an interconnect wire 110a. In various embodiments, the first ILD layer 202a and the second ILD layer 202b may comprise a same dielectric material or different dielectric materials.

The MIM capacitor 114 includes a plurality of protrusions 212a-212c extending outward from the lower surface 114L of the MIM capacitor 114. The plurality of protrusions 212a-212c vertically extend from the lower surface 114L of the MIM capacitor 114 to a plurality of lower interconnect structures $108a_1$-$108a_3$. In some embodiments, the plurality of lower interconnect structures $108a_1$-$108a_3$ may be laterally separated from one another by the dielectric structure 104. In other embodiments (not shown), the plurality of protrusions 212a-212c may extend outward from the lower surface 114L of the MIM capacitor 114 to a single lower interconnect structure that continuously extends below the plurality of protrusions 212a-212c.

The plurality of protrusions 212a-212c are defined by sidewalls that are separated from one another by the dielectric structure 104. For example, a sidewall of a first protrusion 212a may be laterally separated from a sidewall of a second protrusion 212b by one or more ILD layers 202 and by one or more etch stop layers 204. In some embodiments, the plurality of protrusions 212a-212c may be arranged at a pitch 402 and separated by a distance 404. In some embodiments, the pitch 402 may be in a range of between approximately 0.1 μm and approximately 1 μm. In some embodiments, the distance 404 may be in a range of between approximately 0.05 μm and approximately 0.5 μm. A distance 404 that is less than approximately 0.05 μm can lead to collapse (e.g., bending of the dielectric structure into adjacent sidewalls) of the dielectric structure 104 during formation of the MIM capacitor 114, while a distance 404 that is greater than approximately 0.5 μm reduces a capacitance of the MIM capacitor 114 for a given surface area of the substrate 102.

Figure 5A:
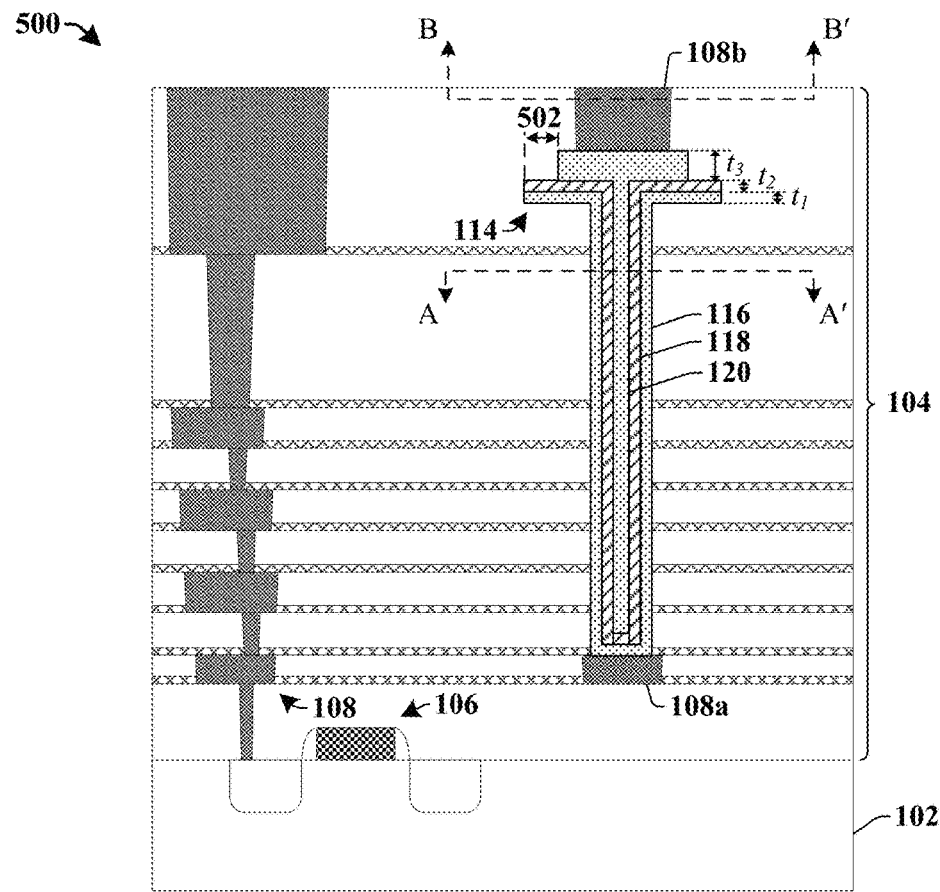
FIGS. 5A-5C illustrate some additional embodiments of an integrated chip having a high density MIM capacitor.
Figures 5B, 5C:
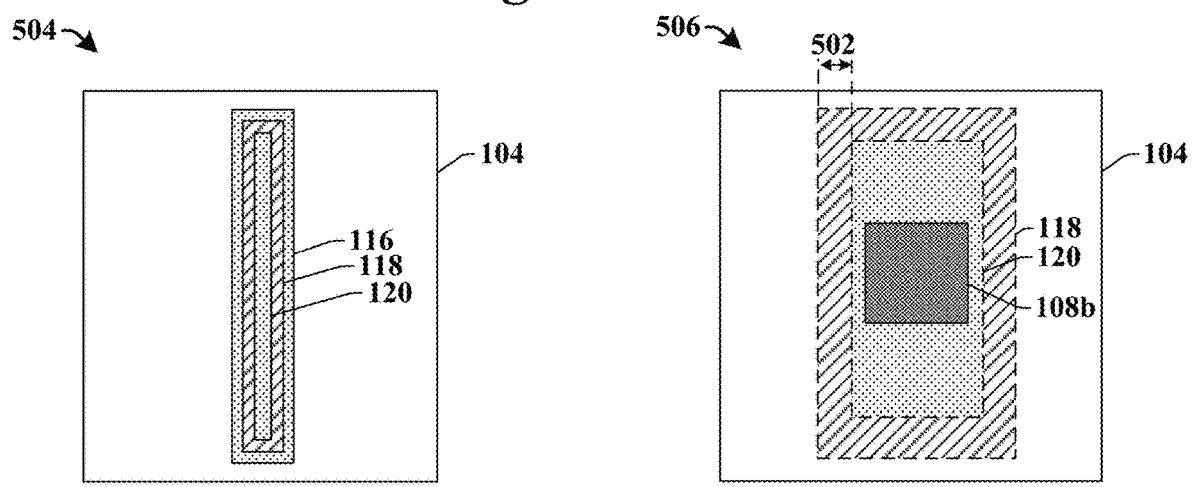

FIGS. 5A-5C illustrate some additional embodiments of an integrated chip having a high density MIM capacitor. FIG. 5A illustrates a cross-sectional view 500 of the integrated chip. FIG. 5B illustrates a top-view 504 of the integrated chip along cross-sectional line A-A' of cross-sectional view 500. FIG. 5C illustrates a top-view 506 of the integrated chip along cross-sectional line B-B' of cross-sectional view 500.

As shown in cross-sectional view 500 of FIG. 5A, the integrated chip comprises a MIM capacitor 114 arranged within a dielectric structure 104 over a substrate 102 and having a lower conductive electrode 116 that is separated from an upper conductive electrode 120 by a capacitor dielectric structure 118. In some embodiments, the upper conductive electrode 120 is laterally set back from outermost sidewalls of the lower conductive electrode 116 and the capacitor dielectric structure 118 by a non-zero distance 502. In some embodiments, the non-zero distance 502 may be in a range of between approximately 0 µm and approximately 0.5 µm.

In some embodiments, the lower conductive electrode 116 and the upper conductive electrode 120 may comprise a same material. In other embodiments, the lower conductive electrode 116 may comprise a different material than the upper conductive electrode 120. In some embodiments, the lower conductive electrode 116 and/or the upper conductive electrode 120 may comprise titanium, titanium nitride, tantalum, tantalum nitride, tantalum silicon nitride, titanium silicon nitride, tungsten nitride (e.g., WN, $WN_2$), tungsten silicon nitride, titanium aluminum, copper, aluminum, cobalt, ruthenium, iridium, iridium oxide, platinum, tungsten, or the like. In some embodiments, the lower conductive electrode 116 may have a first thickness $t_1$ in a range of between approximately 0.005 µm and approximately 0.50 µm. In some embodiments, the upper conductive electrode 120 may have a third thickness $t_3$ in a range of between approximately 0.005 µm and approximately 0.50 µm. In some embodiments, the upper conductive electrode 120 may have a greater height than the lower conductive electrode 116.

In some embodiments, the capacitor dielectric structure 118 may comprise an oxide, a high-k dielectric material, or the like. For example, in various embodiments, the capacitor dielectric structure 118 may comprise one or more of silicon dioxide, silicon nitride (e.g., $Si_3N_4$), tantalum oxide (e.g., $Ta_2O_5$), aluminum oxide (e.g., $Al_2O_3$), lanthanum oxide (e.g., $La_2O_3$), hafnium oxide (e.g., $HfO_2$), zirconium oxide (e.g., $ZrO_2$), zirconium aluminum oxide (e.g., $ZrAl_xO_y$), hafnium aluminum oxide (e.g., $HfAl_xO_y$), bromide titanium oxide (e.g., $BrTiO_2$), strontium titanium oxide (e.g., $SrTiO_2$, $SrTiO_3$), or the like. In some embodiments, the capacitor dielectric structure 118 may have a second thickness $t_2$ in a range of between approximately 0.001 µm and approximately 0.30 µm.

It will be appreciated that in various embodiments the capacitor dielectric structure (e.g., 118) may comprise a single dielectric layer or multiple stacked dielectric layers. FIGS. 6A-7D illustrates some exemplary embodiments of a capacitor dielectric structure comprising multiple layers. Using multiple layers within the capacitor dielectric structure may increase a breakdown voltage of the MIM capacitor. It will be appreciated that the embodiments illustrated in FIGS. 6A-7D are not limiting but rather are merely examples of disclosed capacitor dielectric structures.

FIGS. 6A-6C illustrate some embodiments of an integrated chip having a high density MIM capacitor comprising a multi-film capacitor dielectric structure. FIG. 6A illustrates a cross-sectional view 600 of the integrated chip. FIG. 6B illustrates a top-view 606 of the integrated chip along cross-sectional line A-A' of cross-sectional view 600. FIG. 6C illustrates a top-view 608 of the integrated chip along cross-sectional line B-B' of cross-sectional view 600.

As shown in cross-sectional view 600, the integrated chip comprises a MIM capacitor 114 arranged within a dielectric structure 104 over a substrate 102. The MIM capacitor 114 has a lower conductive electrode 116 that is separated from an upper conductive electrode 120 by a multi-layer capacitor dielectric structure 601. In some embodiments, the multi-layer capacitor dielectric structure 601 may comprise a first dielectric layer 602 and a second dielectric layer 604 over the first dielectric layer 602. In some embodiments, the first dielectric layer 602 may comprise a first dielectric material and the second dielectric layer 604 may comprise a second dielectric material that is different than the first dielectric material. For example, in some embodiments, the first dielectric layer 602 may comprise a first high-k dielectric material (e.g., tantalum nitride, aluminum oxide, or the like), and the second dielectric layer 604 may comprise a second high-k dielectric material (e.g., hafnium oxide, zirconium oxide, or the like). In other embodiments, the first dielectric layer 602 may comprise a high-k dielectric material and the second dielectric layer 604 may comprise a dielectric material having a dielectric constant that is less than or equal to the dielectric constant of silicon dioxide, or vice versa.

As shown in top-view 606, the first dielectric layer 602 and the second dielectric layer 604 completely surround the upper conductive electrode 120 within a plurality of protrusions 212a-212c extending outward from a lower surface of the MIM capacitor 114. As shown in top-view 608, the second dielectric layer 604 may laterally extend past the upper conductive electrode 120 along a first direction 610 and also along a second direction 612 that is perpendicular to the first direction 610, in some embodiments.

FIGS. 7A-7D illustrate cross-sectional views of some additional embodiments of integrated chips having high density MIM capacitors comprising multi-film capacitor dielectric structures.

Figure 7A:
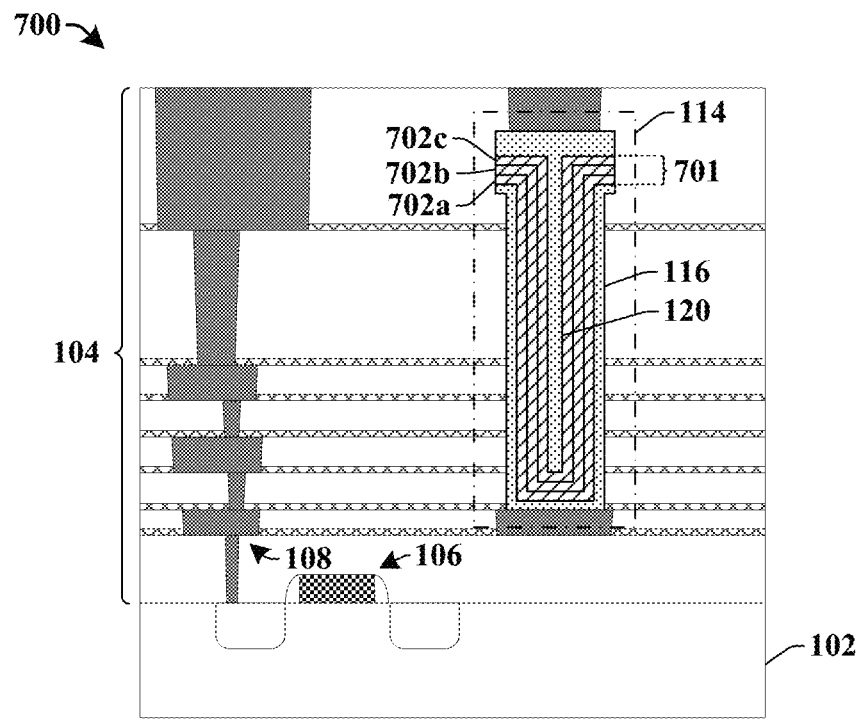
FIGS. 7A-7D illustrate cross-sectional views of some additional embodiments of integrated chips having high density MIM capacitors comprising different multi-film capacitor dielectric structures.

Cross-sectional view 700 of FIG. 7A illustrates some embodiments of a MIM capacitor 114 including a multi-layer capacitor dielectric structure 701 comprising multiple layers 702a-702c of a same dielectric material. In some embodiments, the multi-layer capacitor dielectric structure 701 may comprise a first layer 702a of a first dielectric material, a second layer 702b of the first dielectric material, and a third layer 702c of the first dielectric material. The multiple layers 702a-702c of the same dielectric material may be formed by different (i.e., separate) deposition processes and therefore may be separated along boundaries (e.g., seams) that are visible between the multiple layers 702a-702c. The use of multiple layers 702a-702c of the same dielectric material can improve a quality of the multi-layer capacitor dielectric structure 701, thereby improving electrical characteristics of the MIM capacitor.

Figure 7B:
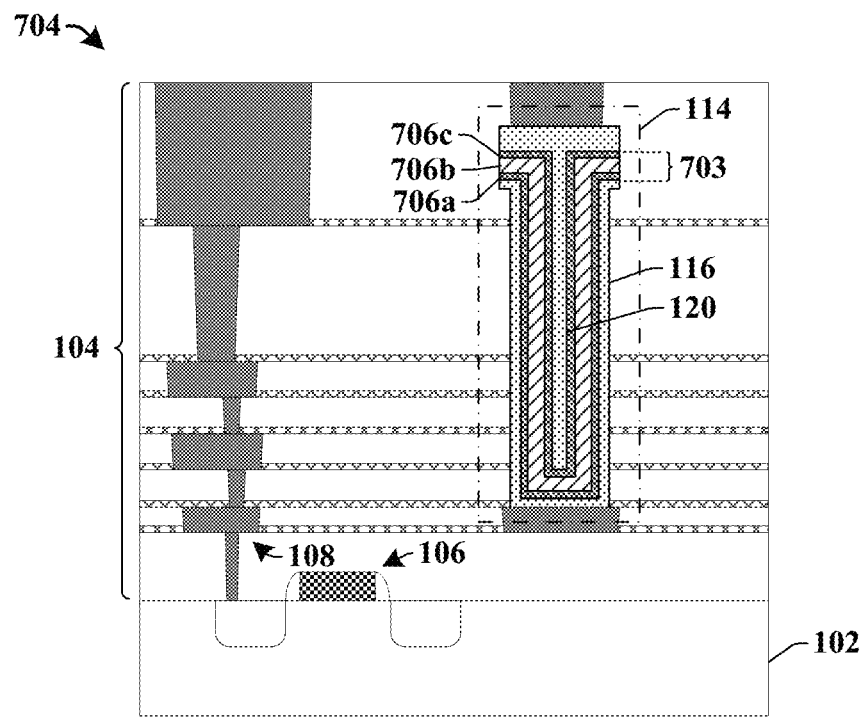

Cross-sectional view 704 of FIG. 7B illustrates some alternative embodiments of a MIM capacitor 114 including a multi-layer capacitor dielectric structure 703 comprising multiple layers 706a-706c having two different dielectric materials. In some embodiments, the multi-layer capacitor dielectric structure 703 may comprise a first layer 706a of a first dielectric material having a lower surface and exterior sidewalls contacting the lower conductive electrode 116. The multi-layer capacitor dielectric structure 703 may further comprise a second layer 706b of a second dielectric material having a lower surface and exterior sidewalls contacting the first layer 706a. The multi-layer capacitor dielectric structure 703 may further comprise a third layer 706c of the first dielectric material having a lower surface and exterior sidewalls contacting the second layer 706b, and further having an upper surface and interior sidewalls contacting the upper conductive electrode 120. In some embodiments, the first dielectric material and the second dielectric material may comprise different dielectric materials. Having the first layer 706a and the third layer 706c contacting opposing sides of the second layer 706b can provide for better interface characteristics between the layers, and thus improve a quality of the multi-layer capacitor dielectric structure 703.

Figure 7C:
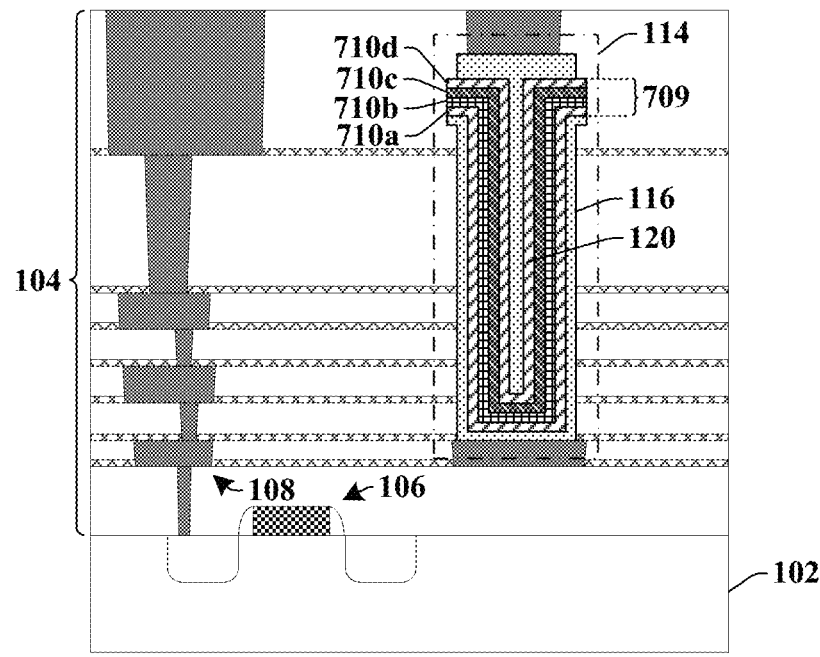

Cross-sectional view 708 of FIG. 7C illustrates some alternative embodiments of a MIM capacitor 114 including a multi-layer capacitor dielectric structure 709 comprising multiple layers 710a-710d having three different dielectric materials. In some embodiments, the multi-layer capacitor dielectric structure 709 may comprise a first layer 710a of a first dielectric material having a lower surface and exterior sidewalls contacting the lower conductive electrode 116. A second layer 710b of a second dielectric material has a lower surface and exterior sidewalls contacting the first layer 710a. The second layer 710b further comprises an upper surface and interior sidewalls contacting a third layer 710c of a third dielectric material. The third layer 710c has an upper surface and interior sidewalls contacting a fourth layer 710d of the first dielectric material. The fourth layer 710d further comprises an upper surface and interior sidewalls contacting the upper conductive electrode 120. In some embodiments, the first dielectric material, the second dielectric material, and the third dielectric material may comprise different dielectric materials.

Figure 7D:
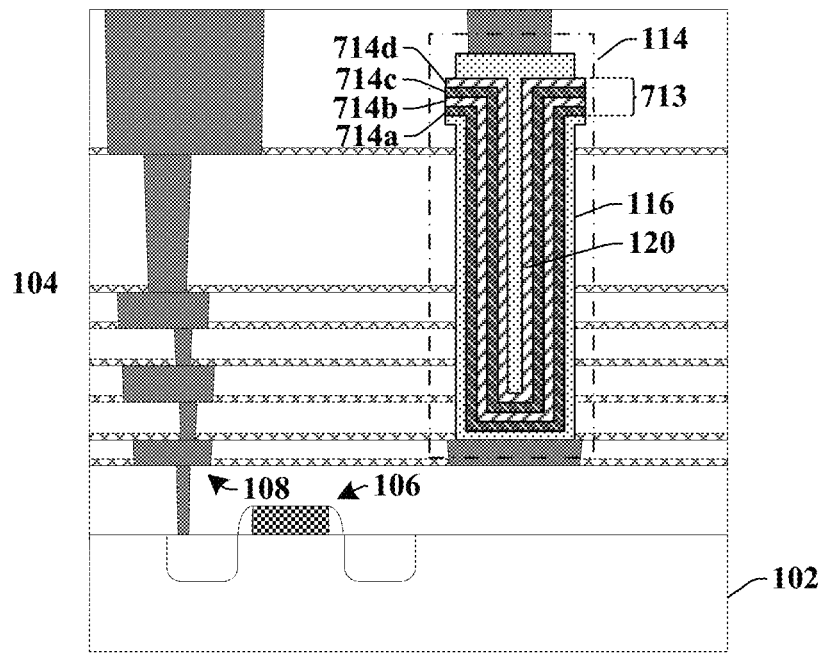

Cross-sectional view 712 of FIG. 7D illustrates some alternative embodiments of a MIM capacitor 114 including a multi-layer capacitor dielectric structure 713 comprising a plurality of layers of dielectric materials arranged in a periodically repeating pattern. In some embodiments, the multi-layer capacitor dielectric structure 713 may comprise a first layer 714a of first dielectric material having a lower surface and exterior sidewalls contacting the lower conductive electrode 116. A second layer 714b of a second dielectric material has a lower surface and exterior sidewalls contacting the first layer 714a. The second layer 714b comprises an upper surface and interior sidewalls contacting a third layer 714c of the first dielectric material. The third layer 714c comprises an upper surface and interior sidewalls contacting a fourth layer 714d of the second dielectric material. The fourth layer 714d comprises an upper surface and interior sidewalls contacting the upper conductive electrode 120. In some embodiments, the first dielectric material and the second dielectric material may comprise different dielectric materials.

Figure 8:
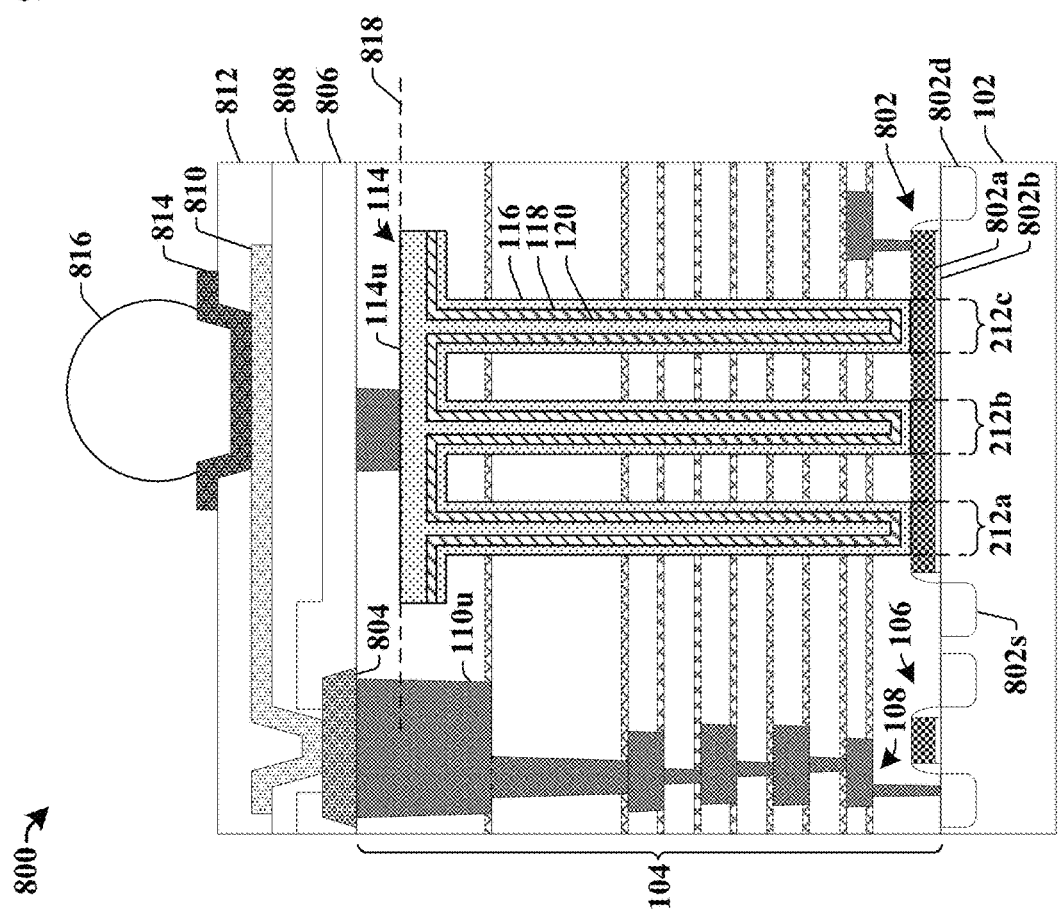

FIG. 8 illustrates a cross-sectional view of some additional embodiments of an integrated chip 800 having a high density MIM capacitor.

The integrated chip 800 comprises a transistor device 106 arranged within a substrate 102. The transistor device 106 is coupled to a plurality of conductive interconnect layers 108 surrounded by a dielectric structure 104 over the substrate 102. A bond pad 804 is arranged over the dielectric structure 104. The bond pad 804 is arranged onto a topmost interconnect wire 110u of the plurality of conductive interconnect layers 108. A first passivation layer 806 is arranged over the dielectric structure 104 and the bond pad 804. In some embodiments, the first passivation layer 806 may comprise an oxide (e.g., silicon dioxide), a nitride (e.g., silicon oxynitride), a carbide (e.g., silicon carbide), or the like. A second passivation layer 808 is arranged on the first passivation layer 806 and the bond pad 804. In some embodiments, the second passivation layer 808 may comprise a polymer, such as a polyimide, for example. A redistribution layer 810 is arranged over the first passivation layer 806 and electrically couples the bond pad 804 to an overlying under bump metallurgy (UBM) layer 814 and to a solder ball 816 arranged over the UBM layer 814. A third passivation layer 812 is arranged over the second passivation layer 808 and the redistribution layer 810. The third passivation layer 812 laterally surrounds the UBM layer 814.

A transistor device 802 is also arranged within the substrate 102 at a position that is directly below a MIM capacitor 114 that is surrounded by the dielectric structure 104. In some embodiments, the transistor device 802 may comprise an active device (e.g., which is electrically coupled to other devices within a circuit having logical functionality), while in other embodiments, the transistor device 802 may comprise a dummy device (e.g., which is not electrically coupled to other devices within a circuit having logical functionality). The transistor device 802 comprises a gate electrode 802a separated from the substrate 102 by a gate dielectric layer 802b. The gate electrode 802a is laterally disposed between a source region 802s and a drain region 802d within the substrate 102.

The MIM capacitor 114 comprises a plurality of protrusions 212a-212c extending outward from a lower surface of the MIM capacitor 114 to contact an upper surface of the gate electrode 802a. For example, the plurality of protrusions 212a-212c are defined by sidewalls that vertically extend from the lower surface of the MIM capacitor 114 to the upper surface of the gate electrode 802a. In some embodiments, the gate electrode 802a may have a greater width than a gate electrode of transistor device 106, so as to allow for the plurality of protrusions 212a-212c to contact the gate electrode 802a. In some embodiments, the MIM capacitor 114 has an uppermost surface 114u that is arranged along a horizontal plane 818 that intersects the topmost interconnect wire 110u. By having the MIM capacitor 114 extend from the gate electrode 802a to a vertical position adjacent to the topmost interconnect wire 110u, the MIM capacitor 114 is able to achieve a large capacitance while consuming a relatively small surface area of the substrate 102. Furthermore, by connecting the MIM capacitor 114 to the gate electrode 802a of an active transistor device, the MIM capacitor 114 can for electrical routing (e.g., in place of conductive interconnect wires and/or vias).

Figure 9:
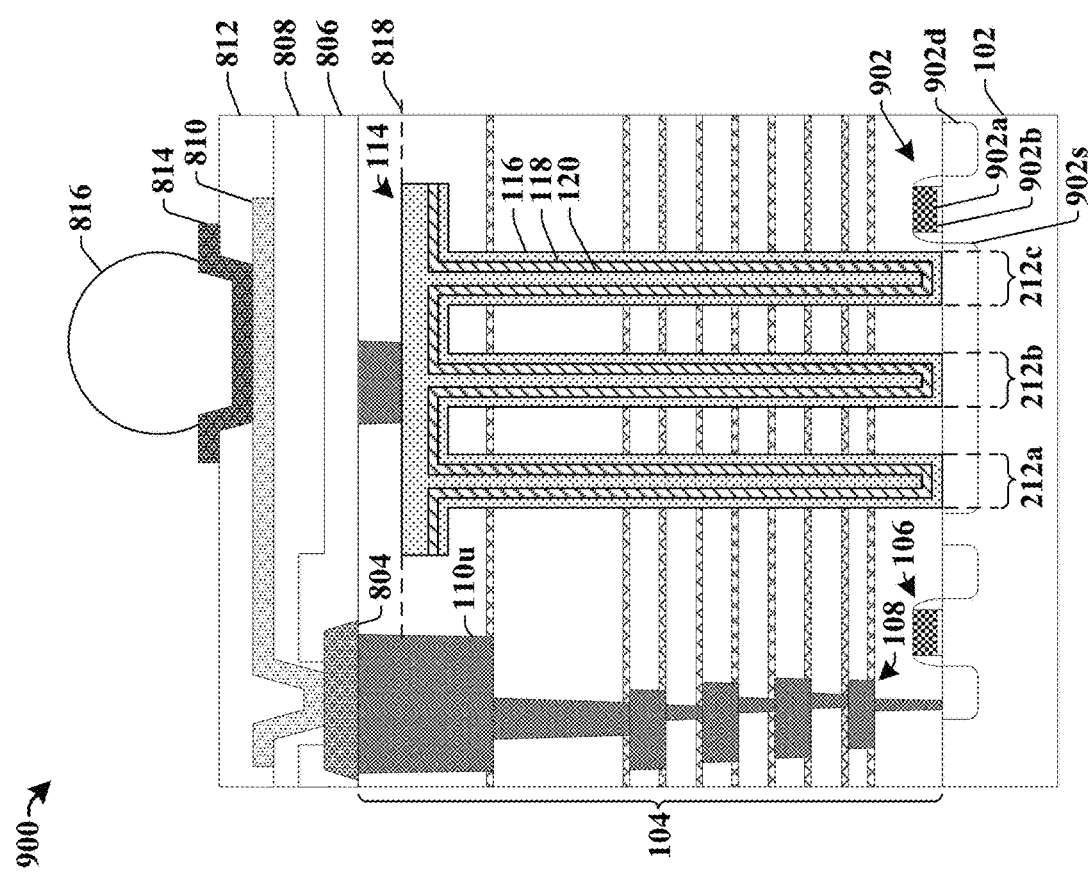
FIGS. 8-15 illustrate some additional embodiments of integrated chips having high density MIM capacitors.

FIG. 9 illustrates a cross-sectional view of some additional embodiments of an integrated chip 900 having a high density MIM capacitor.

The integrated chip 900 comprises a transistor device 902 arranged within a substrate 102 at a position that is directly below a MIM capacitor 114 surrounded by a dielectric structure 104. The transistor device 902 comprises a gate electrode 902a separated from the substrate 102 by a gate dielectric layer 902b. The gate electrode 902a is laterally disposed between a source region 902s and a drain region 902d within the substrate 102. In some embodiments, the source region 902s may have a greater width than the drain region 902d, or vice versa. In some embodiments, the MIM capacitor 114 comprises a plurality of protrusions 212a-212c extending outward from a lower surface of the MIM capacitor 114 to contact the source region 902s. In some embodiments, the MIM capacitor 114 has an uppermost surface 114u that is arranged along a horizontal plane 818 that intersects a topmost interconnect wire 110u. By having the plurality of protrusions 212a-212c vertically extend from the source region 902s to a vertical position adjacent to the topmost interconnect wire 110u, the MIM capacitor 114 is able to achieve a large capacitance while consuming a relatively small surface area of the substrate 102.

Figure 10:
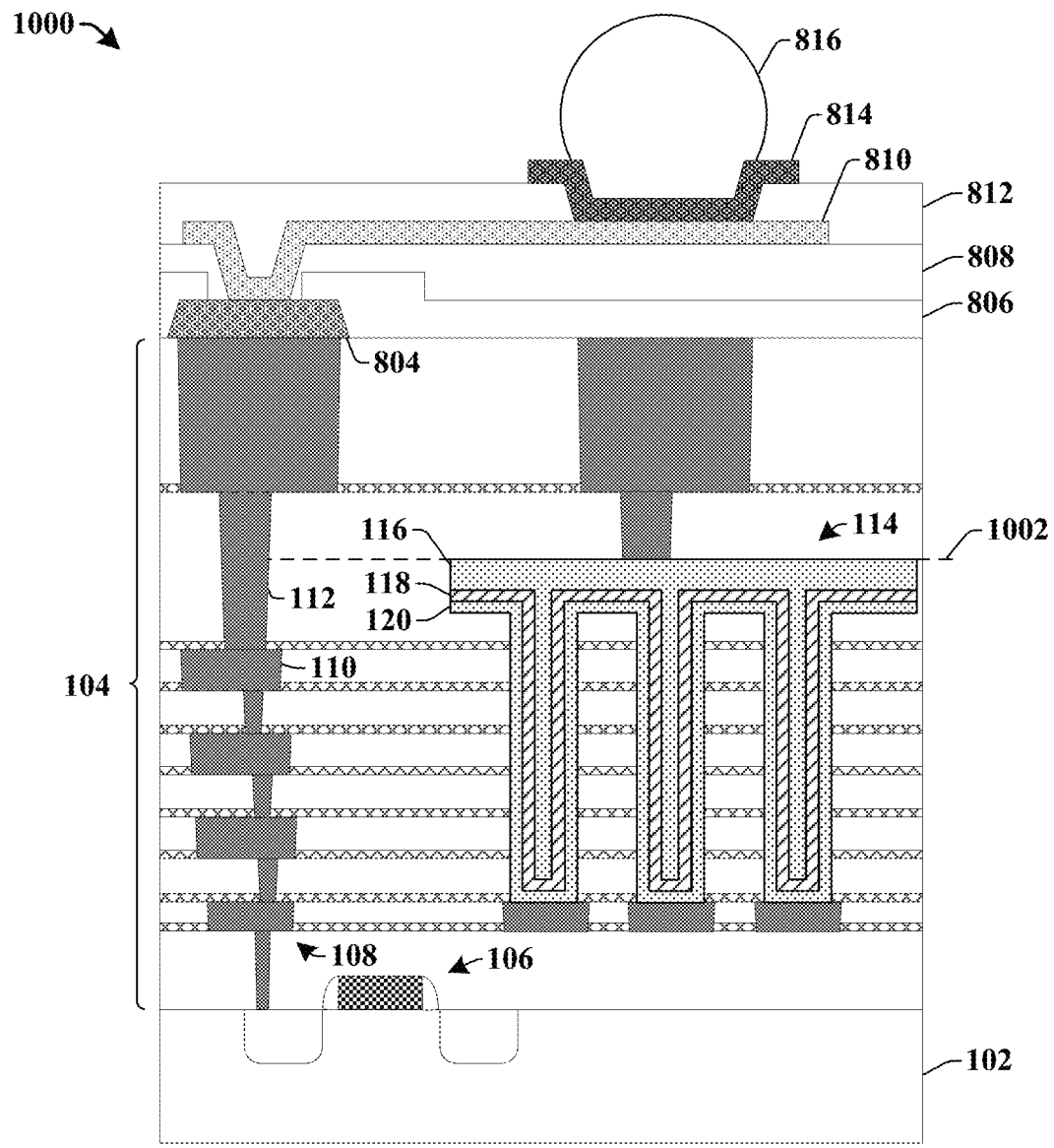

FIG. 10 illustrates a cross-sectional view of some additional embodiments of an integrated chip 1000 having a high density MIM capacitor.

The integrated chip 1000 comprises a transistor device 106 arranged within a substrate 102. The transistor device 106 is coupled to a plurality of conductive interconnect layers 108 surrounded by a dielectric structure 104 over the substrate 102. The plurality of conductive interconnect layers 108 comprise interconnect wires 110 and interconnect vias 112. A MIM capacitor 114 is vertically arranged between a lower interconnect layer 108a and an upper interconnect layer 108b. A top surface of the MIM capacitor 114 extends along a horizontal plane 1002 that intersects a sidewall of one of the interconnect vias 112.

Figure 11:
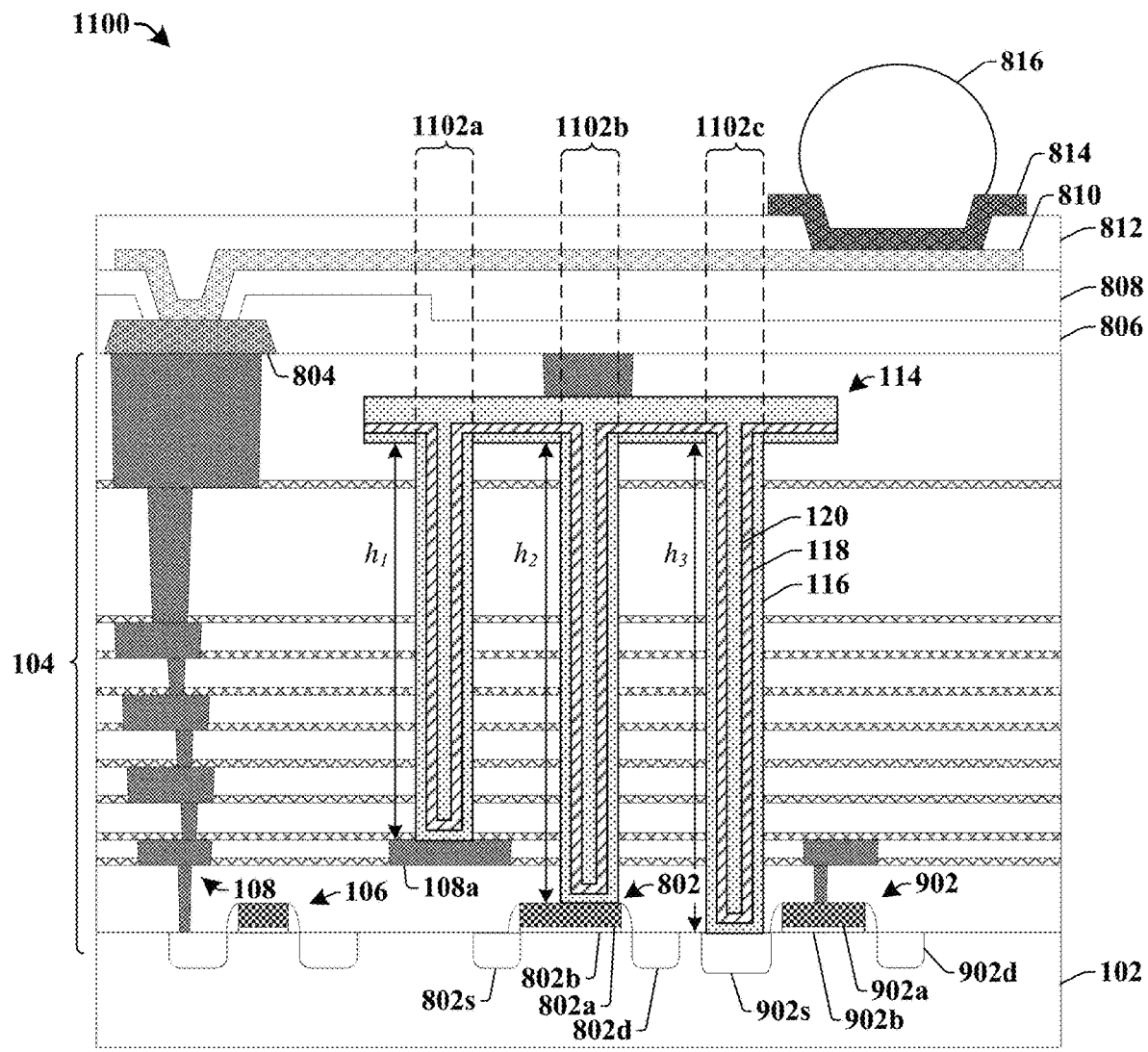

FIG. 11 illustrates a cross-sectional view of some additional embodiments of an integrated chip 1100 having a high density MIM capacitor.

The integrated chip 1100 comprises a MIM capacitor 114 that is surrounded by a dielectric structure 104 over a substrate 102. The MIM capacitor 114 comprises a plurality of protrusions 1102a-1102c extending outward from a lower surface of the MIM capacitor 114. The plurality of protrusions 1102a-1102c have different heights and extend to different vertical positions over the substrate 102. For example, the plurality of protrusions 1102a-1102c may comprise a first protrusion 1102a having a first height $h_1$, a second protrusion 1102b having a second height $h_2$, and a third protrusion 1102c having a third height $h_3$. In some embodiments, the first protrusion 1102a has a bottom surface contacting a lower interconnect layer 108a (e.g., a conductive interconnect wire) disposed within the dielectric structure 104. In some embodiments, the second protrusion 1102b has a bottom surface contacting a gate electrode 802a of a transistor device 802. In some embodiments, the third protrusion 1102c has a bottom surface contacting a source region 902s of a transistor device 902.

Figure 12:
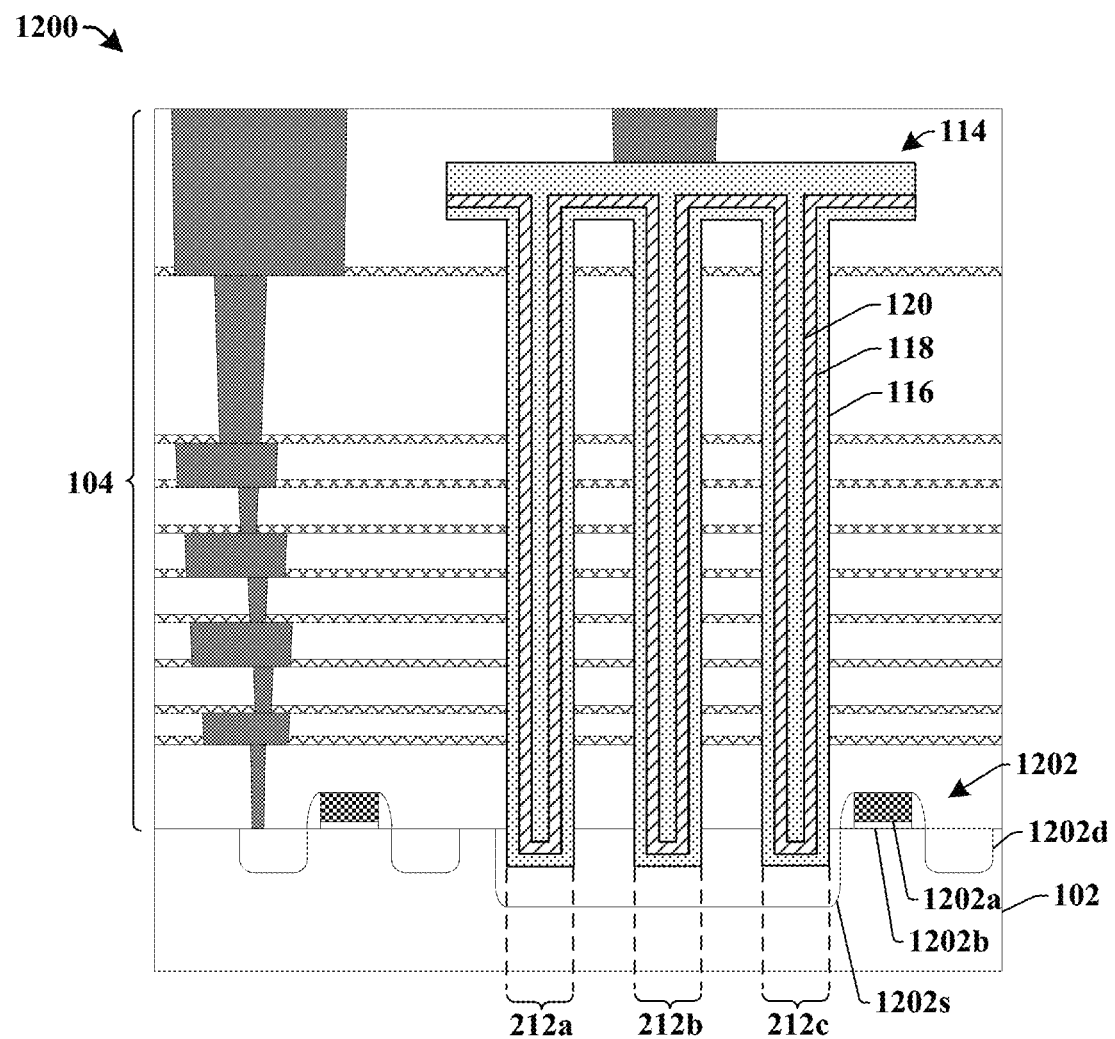

FIG. 12 illustrates a cross-sectional view of some additional embodiments of an integrated chip 1200 having a high density MIM capacitor.

The integrated chip 1200 comprises a transistor device 1202 arranged within a substrate 102 at a position that is directly below a MIM capacitor 114 surrounded by a dielectric structure 104. The transistor device 1202 comprises a gate electrode 1202a separated from the substrate 102 by a gate dielectric layer 1202b. The gate electrode 1202a is laterally disposed between a source region 1202s and a drain region 1202d within the substrate 102. In some embodiments, the source region 1202s may have a greater width than the drain region 1202d. The MIM capacitor 114 comprises a plurality of protrusions 212a-212c extending outward from a lower surface of the MIM capacitor 114 to a position that is within the source region 1202s (i.e., that is laterally surrounded by the source region 1202s). By having the plurality of protrusions 212a-212c vertically extend to within the source region 1202s, the MIM capacitor 114 is able to achieve a large capacitance while consuming a relatively small surface area of the substrate 102.

Although FIGS. 9 and 11-12 illustrate MIM capacitors having one or more protrusions contacting a source region, it will be appreciated that in other embodiments the one or more protrusions may extend outward from the lower surface of the MIM capacitor to contact the drain region. Having the plurality of protrusions extend to the source region, the drain region, and/or a gate electrode, allows for the MIM capacitor to be used in routing (e.g., in place of interconnect wires/vias), and therefore enhances layout flexibility and/or reduces an area used by conductive interconnect wiring.

Figure 13A:
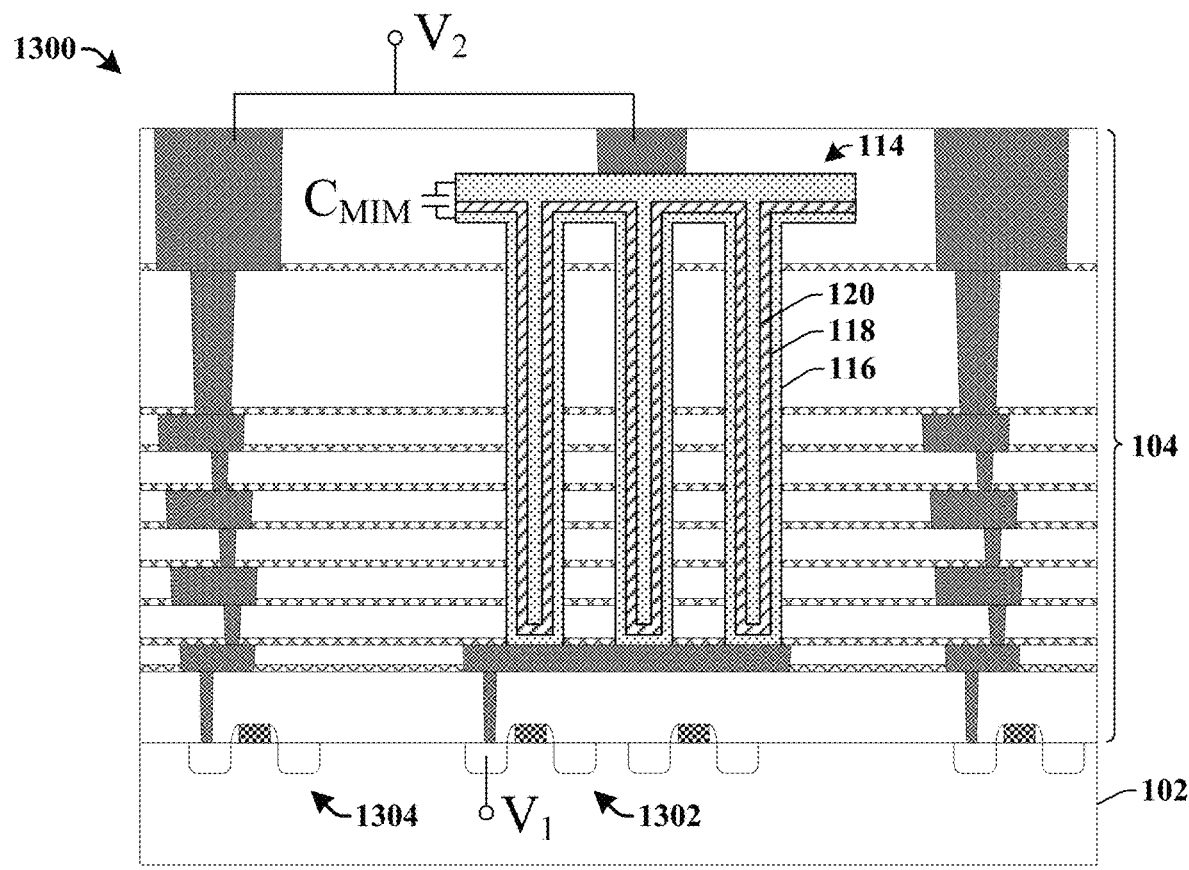
Figure 13B:
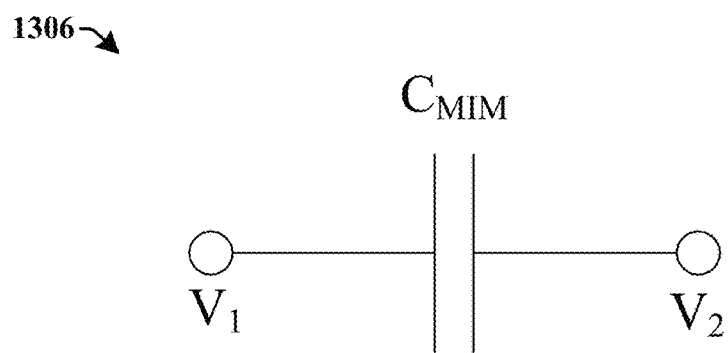

FIG. 13A illustrates a cross-sectional view of some additional embodiments of an integrated chip 1300 having a high density MIM capacitor. FIG. 13B illustrates a schematic diagram 1306 of the integrated chip 1300 of FIG. 13A.

As shown in the cross-sectional view of FIG. 13A, the integrated chip 1300 has a MIM capacitor 114 comprising a capacitor dielectric structure 118 disposed between a lower conductive electrode 116 and an upper conductive electrode 120. The lower conductive electrode 116 is coupled to a first transistor 1302 and the upper conductive electrode 120 is coupled to a second transistor 1304. During operation, the first transistor 1302 may apply a first voltage $V_1$ to the lower conductive electrode 116, while the second transistor 1304 may apply a second voltage $V_2$ to the upper conductive electrode 120. The MIM capacitor 114 has a capacitance $C_{MIM}$ and will store an energy that is proportional to a surface area of the lower conductive electrode 116 and the upper conductive electrode 120.

Figure 14:
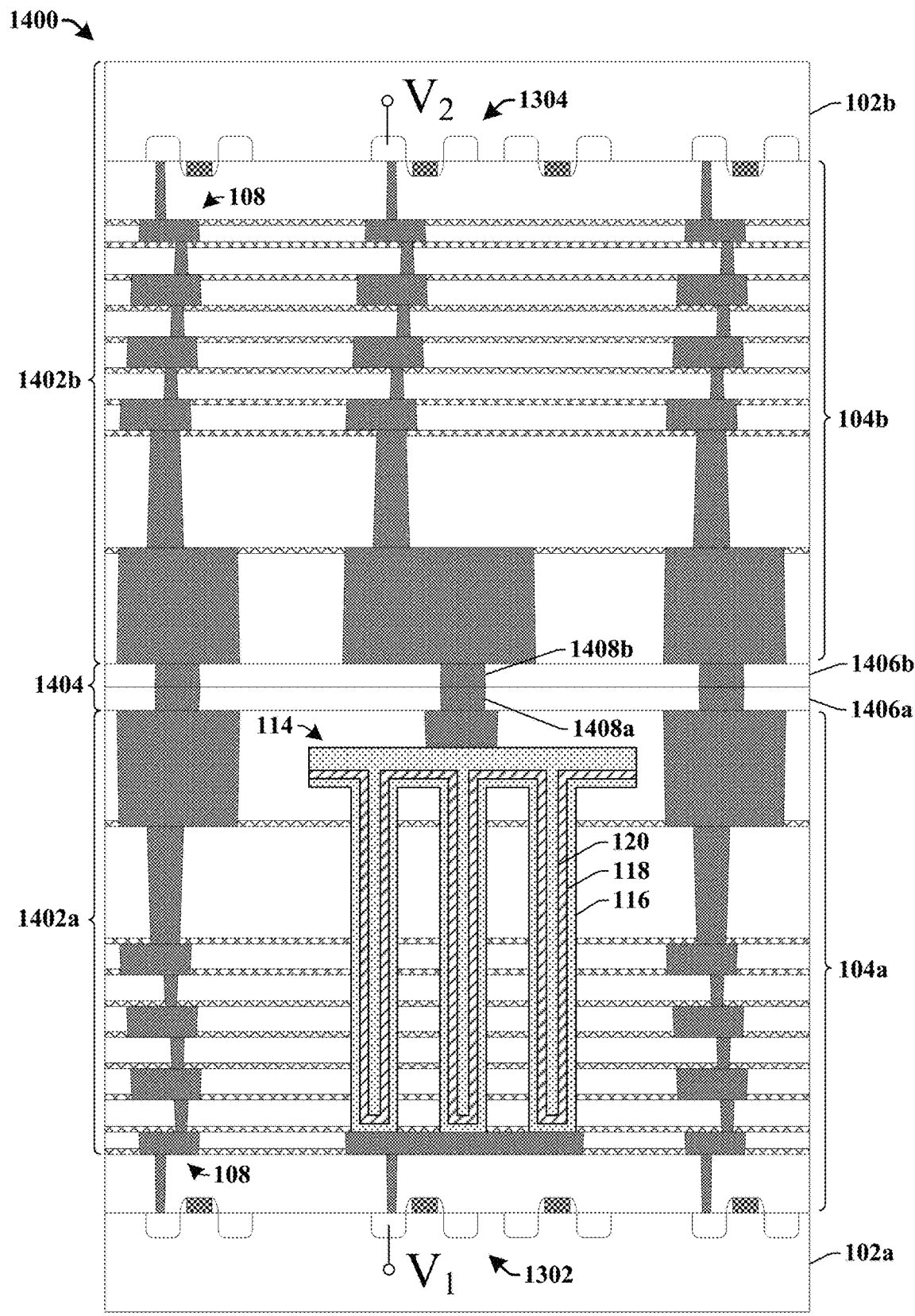

FIG. 14 illustrates some additional embodiments of a three-dimensional integrated chip (3DIC) 1400 having a high density MIM capacitor that vertically extends over a plurality of conductive interconnect layers.

The 3DIC 1400 comprises a first IC die 1402a and a second IC die 1402b stacked onto the first IC die 1402a. The first IC die 1402a comprises a first substrate 102a and a first dielectric structure 104a on the first substrate 102a. The second IC die 1402b comprises a second substrate 102b and a second dielectric structure 104b on the second substrate 102b. The first IC die 1402a is coupled to the second IC die 1402b along a hybrid bonding interface region 1404. In some embodiments, the hybrid bonding interface region 1404 comprises a first dielectric bonding layer 1406a surrounding a first conductive bonding structure 1408a and a second dielectric bonding layer 1406b surrounding a second conductive bonding structure 1408b. In some embodiments, the first dielectric bonding layer 1406a and the second dielectric bonding layer 1406b may comprise an oxide, a nitride, or the like. In some embodiments, the first conductive bonding structure 1408a and the second conductive bonding structure 1408b may comprise aluminum, copper, or the like.

A MIM capacitor 114 is arranged within the first dielectric structure 104a. The MIM capacitor 114 comprises a capacitor dielectric structure 118 disposed between a lower conductive electrode 116 and an upper conductive electrode 120. The lower conductive electrode 116 is coupled to a first transistor 1302 within the first substrate 102a. The upper conductive electrode 120 is coupled to a second transistor 1304 within the second substrate 102b. During operation, the first transistor 1302 may apply a first voltage $V_1$ to the lower conductive electrode 116, while the second transistor 1304 may apply a second voltage $V_2$ to the upper conductive electrode 120.

Figure 15:
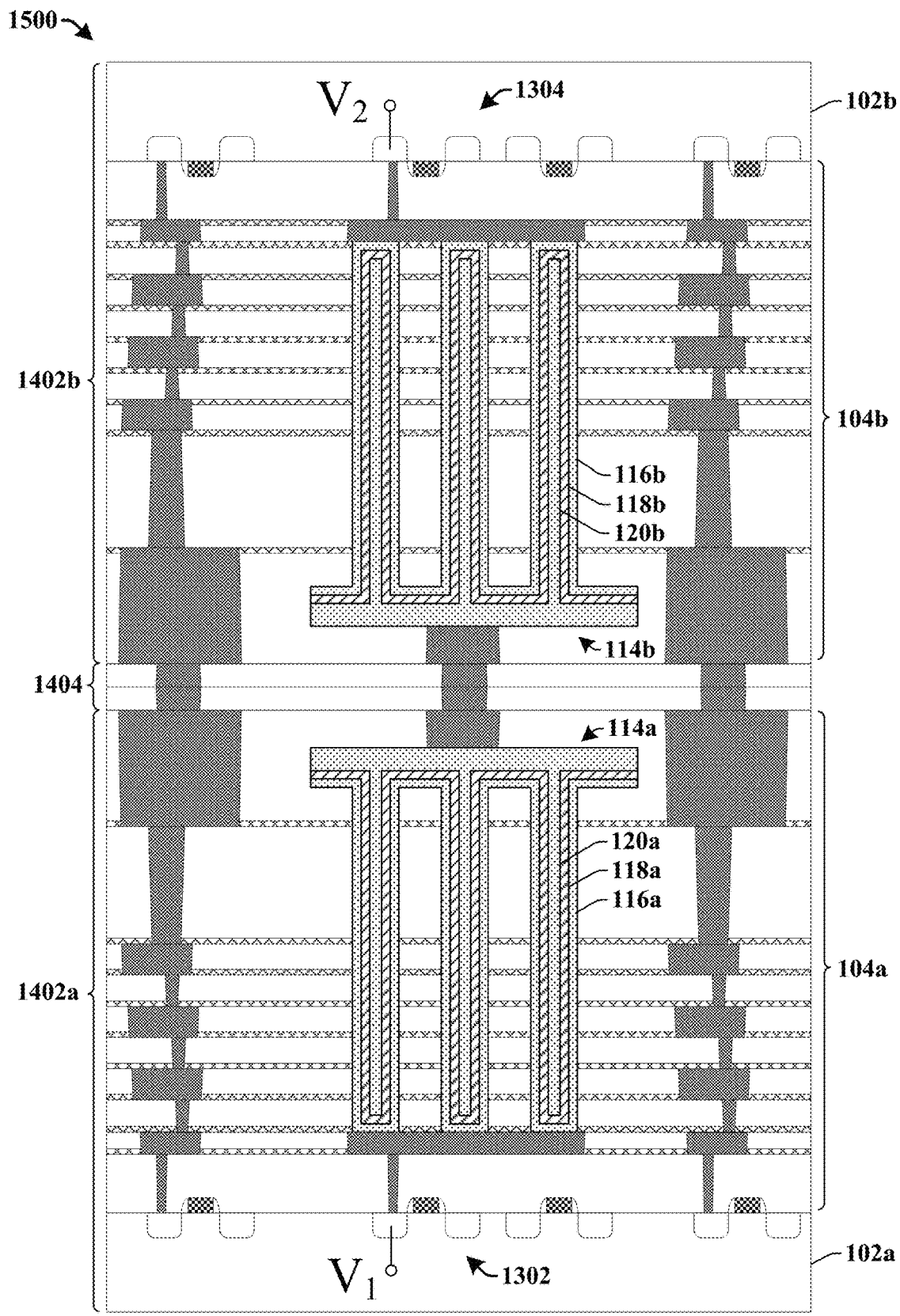

FIG. 15 illustrates some additional embodiments of a 3DIC 1500 having a high density MIM capacitor that vertically extends over a plurality of conductive interconnect layers.

The 3DIC 1500 comprises a first IC die 1402a and a second IC die 1402b stacked onto the first IC die 1402a. The first IC die 1402a comprises a first substrate 102a and a first dielectric structure 104a on the first substrate 102a. The second IC die 1402b comprises a second substrate 102b and a second dielectric structure 104b on the second substrate 102b. The first IC die 1402a is coupled to the second IC die 1402b along a hybrid bonding interface region 1404.

A first MIM capacitor 114a is arranged within the first dielectric structure 104a. The first MIM capacitor 114a comprises a first dielectric structure 118a disposed between a first conductive electrode 116a and a second conductive electrode 120a. The first conductive electrode 116a is coupled to a first transistor 1302 within the first substrate 102a. The second conductive electrode 120a is coupled to a second MIM capacitor 114b arranged within the second dielectric structure 104b. The second MIM capacitor 114b comprises a second dielectric structure 118b disposed between a third conductive electrode 116b and a fourth conductive electrode 120b. The third conductive electrode 116b is coupled to a second transistor 1304 within the second substrate 102b. During operation, the first transistor 1302 may apply a first voltage $V_1$ to the first conductive electrode 116a, while the second transistor 1304 may apply a second voltage $V_2$ to the third conductive electrode 116b.

FIGS. 16-25 illustrate cross-sectional views 1600-2500 of some embodiments of a method of forming an integrated chip having a high density MIM capacitor that vertically extends over a plurality of conductive interconnect layers. Although FIGS. 16-25 are described in relation to a method, it will be appreciated that the structures disclosed in FIGS. 16-25 are not limited to such a method, but instead may stand alone as structures independent of the method.

Figure 16:
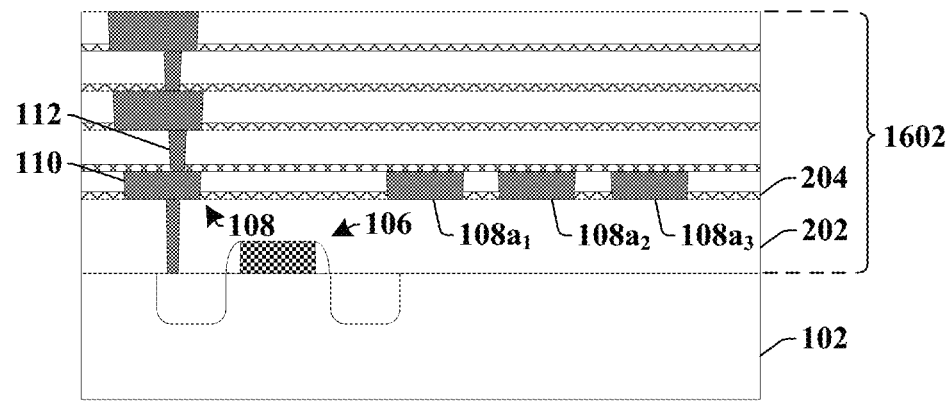

As shown in cross-sectional view 1600 of FIG. 16, a plurality of conductive interconnect layers 108 are formed within a first dielectric structure 1602 over a substrate 102. In some embodiments, the first dielectric structure 1602 may comprise a plurality of stacked ILD layers 202 separated by a plurality of etch stop layers 204. In some embodiments, the plurality of conductive interconnect layers 108 respectively comprise an interconnect wires 110 and an interconnect via 112 coupled to a transistor device 106 formed within the substrate 102. In some embodiments, the plurality of conductive interconnect layers 108 may further comprise a lower interconnect layer having one or more lower interconnect structures 108a$_1$-108a$_3$, which are laterally offset from the plurality of conductive interconnect layers 108. In some embodiments, the plurality of conductive interconnect layers 108 and/or the one or more lower interconnect structures 108a$_1$-108a$_3$ may respectively be formed by way of a damascene process. In such embodiments, an ILD layer 202 is formed over the substrate 102. The ILD layer 202 is subsequently etched to form a via hole and/or trench, which is filled with a conductive material (e.g., tungsten, copper, and/or aluminum). A chemical mechanical planarization (CMP) process is subsequently performed to remove excess of the conductive material from over the ILD layer 202.

Figure 17:
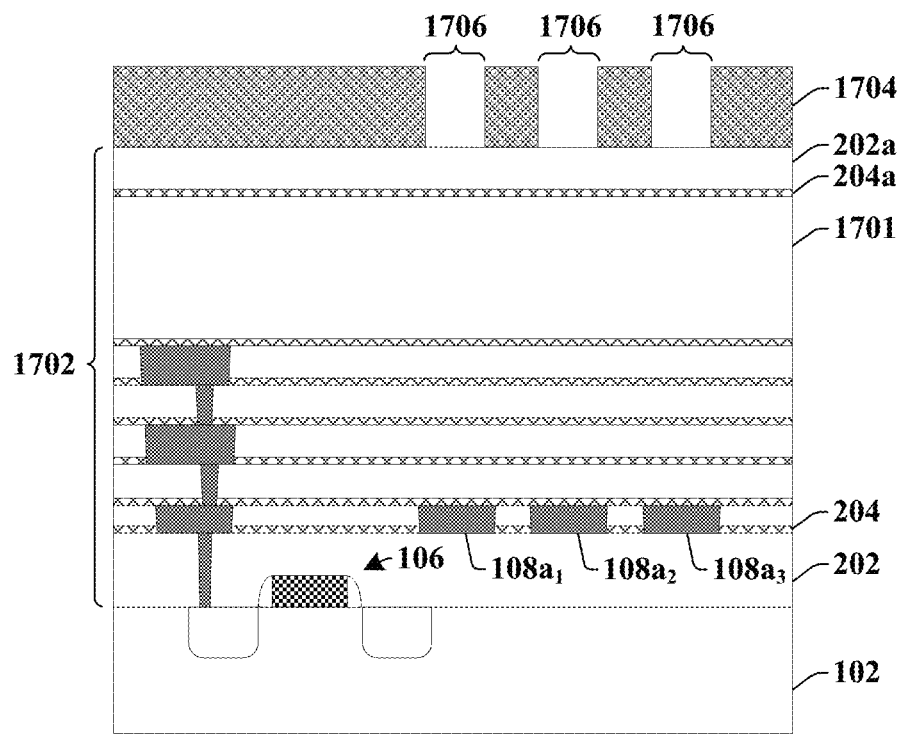

As shown in cross-sectional view 1700 of FIG. 17, one or more additional ILD layers, 1701 and 202a, are formed over the substrate 102 to define a second dielectric structure 1702. In some embodiments, the one or more additional ILD layers, 1701 and 202a, are formed by way of deposition processes (e.g., chemical vapor deposition (CVD), plasma enhanced chemical vapor deposition (PE-CVD), atomic layer deposition (ALD), physical vapor deposition (PVD), etc.). In some embodiments, the one or more etch stop layers 204a may be formed between the one or more additional ILD layers, 1701 and 202a.

A first patterned masking layer 1704 is formed over the one or more additional ILD layers, 1701 and 202a. In some embodiments, the first patterned masking layer 1704 may comprise a hard mask comprising titanium, silicon carbide, silicon oxy-nitride, tantalum, or the like. In such embodiments, the first patterned masking layer 1704 may be deposited over the second dielectric structure 1702 and subsequently patterned using a photolithography process to form sidewalls defining one or more openings 1706 exposing an upper surface of the second dielectric structure 1702. The openings may be directly over the one or more lower interconnect structures 108a$_1$-108a$_3$. In other embodiments, the first patterned masking layer 1704 may comprise photoresist.

Figure 18:
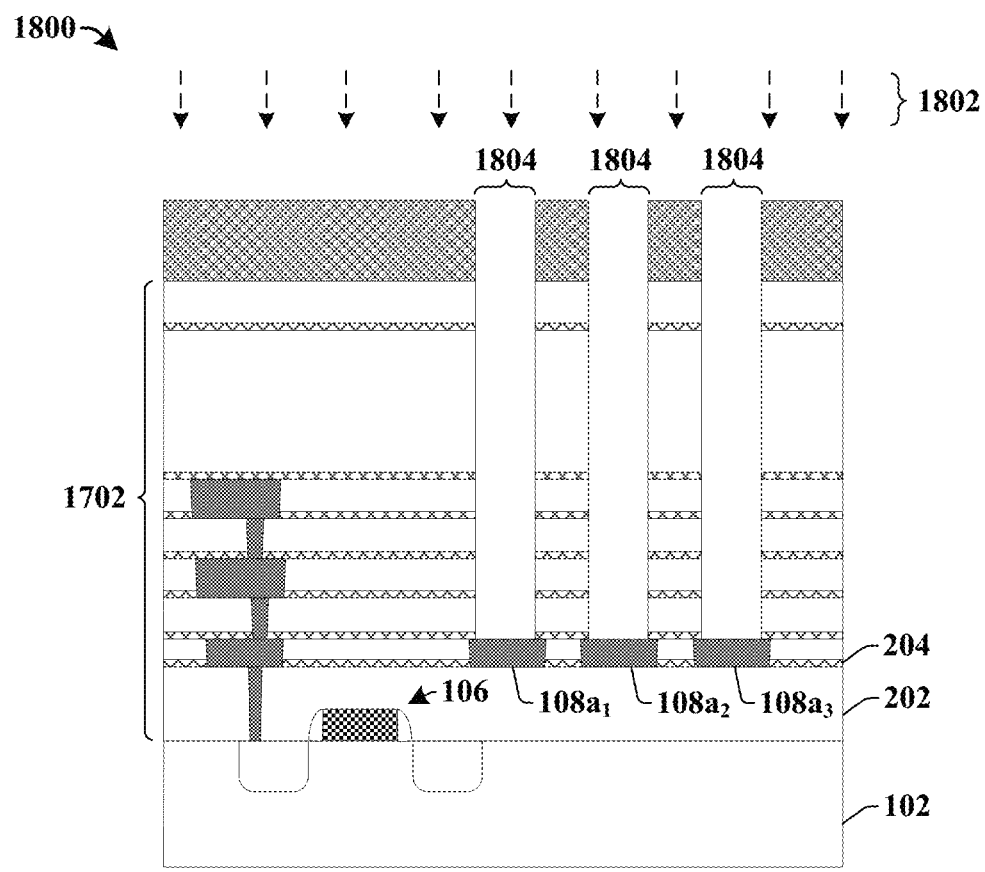

As shown in cross-sectional view 1800 of FIG. 18, a first etching process is performed on the second dielectric structure 1702 to define one or more trenches 1804 extending into the second dielectric structure 1702. The one or more trenches 1804 vertically extend from the upper surface of the second dielectric structure 1702, past two or more of the plurality of conductive interconnect layers 108, to the one or more lower interconnect structures 108a$_1$-108a$_3$. In some embodiments, the first etching process is performed by exposing the second dielectric structure 1702 to one or more first etchants 1802 according to the first patterned masking layer 1704. In some embodiments, the one or more first etchants 1802 may comprise a dry etchant. In some embodiments, the dry etchant may have an etching chemistry comprising one or more of oxygen ($O_2$), nitrogen ($N_2$), hydrogen ($H_2$), argon (Ar), and/or a fluorine species (e.g., $CF_4$, $CHF_3$, $C_4F_8$, etc.).

Figure 19:
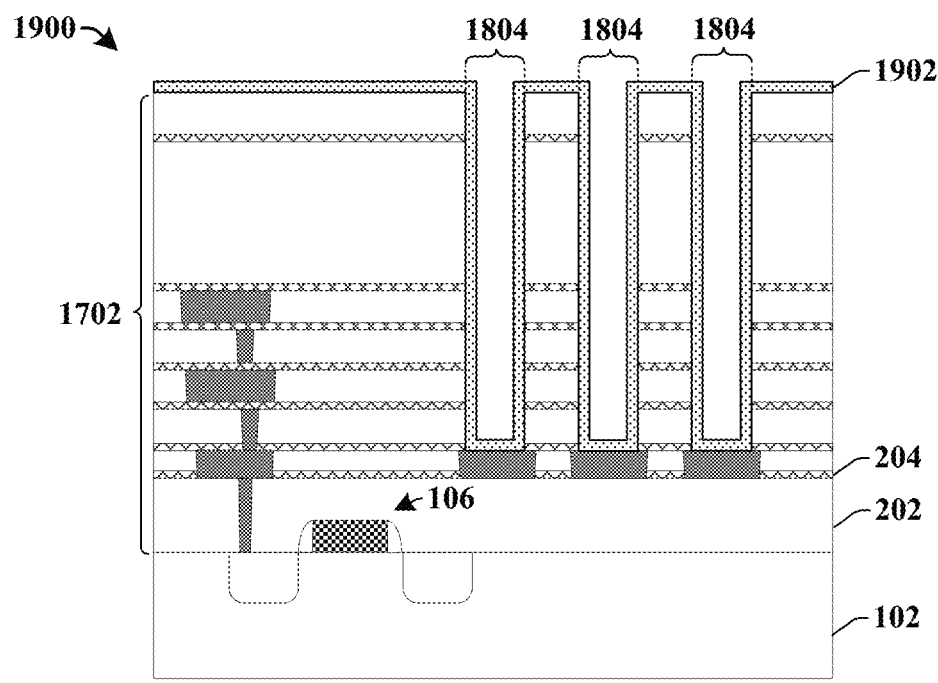

As shown in cross-sectional view 1900 of FIG. 19, a lower conductive electrode layer 1902 is formed along sidewalls and a lower surface of the second dielectric structure 1702 defining the one or more trenches 1804. In various embodiments, the lower conductive electrode layer 1902 may comprise titanium, titanium nitride, tantalum, tantalum nitride, tantalum silicon nitride, titanium silicon nitride, tungsten nitride (e.g., WN, $WN_2$), tungsten silicon nitride, titanium aluminum, copper, aluminum, cobalt, ruthenium, iridium, iridium oxide, platinum, tungsten, or the like. In some embodiments, the lower conductive electrode layer 1902 may be formed by way of a conformal deposition process. For example, in various embodiments, the lower conductive electrode layer 1902 may be formed by way of an ALD process, a CVD process, or a PVD process.

Figure 20:
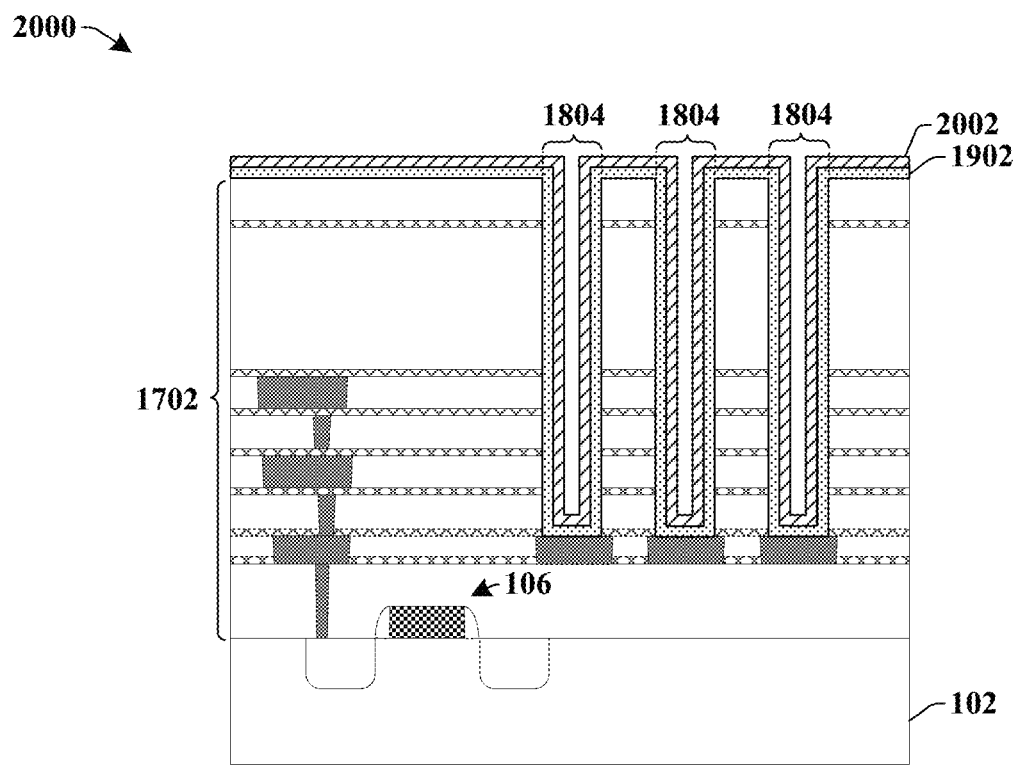

As shown in cross-sectional view 2000 of FIG. 20, one or more dielectric layers 2002 are formed within the one or more trenches 1804 and along sidewalls and a lower surface of the lower conductive electrode layer 1902. In various embodiments, the one or more dielectric layers 2002 may comprise one or more of silicon dioxide, silicon nitride (e.g., $Si_3N_4$), tantalum oxide (e.g., $Ta_2O_5$), aluminum oxide (e.g., $Al_2O_3$), lanthanum oxide (e.g., $La_2O_3$), hafnium oxide (e.g., $HfO_2$), zirconium oxide (e.g., $ZrO_2$), zirconium aluminum oxide (e.g., $ZrAl_xO_y$), hafnium aluminum oxide (e.g., $HfAl_xO_y$), bromide titanium oxide (e.g., $BrTiO_2$), strontium titanium oxide (e.g., $SrTiO_2$, $SrTiO_3$), or the like. In some embodiments, the one or more dielectric layers 2002 may be formed by way of a conformal deposition process (e.g., an ALD process, a CVD process, or a PVD process).

Figure 21:
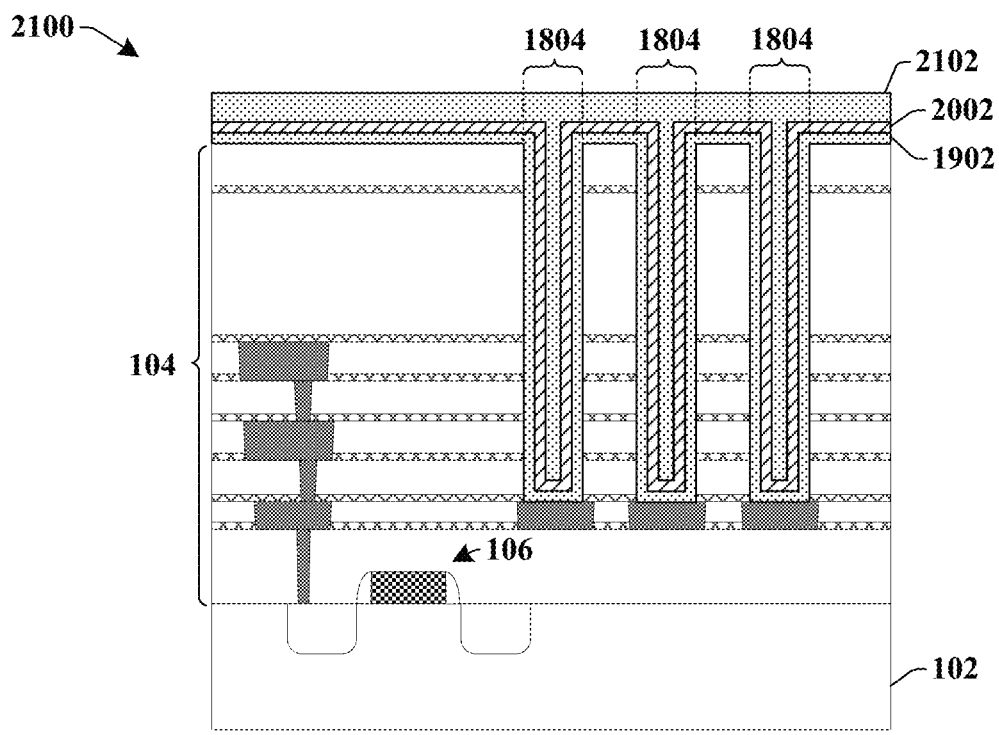

As shown in cross-sectional view 2100 of FIG. 21, an upper conductive electrode layer 2102 is formed within the one or more trenches 1804 and along sidewalls and a lower surface of the one or more dielectric layers 2002. In various embodiments, the upper conductive electrode layer 2102 may comprise titanium, titanium nitride, tantalum, tantalum nitride, tantalum silicon nitride, titanium silicon nitride, tungsten nitride (e.g., WN, $WN_2$), tungsten silicon nitride, titanium aluminum, copper, aluminum, cobalt, ruthenium, iridium, iridium oxide, platinum, tungsten, or the like. In some embodiments, the upper conductive electrode layer 2102 may be formed by way of a conformal deposition process. For example, in various embodiments, the upper conductive electrode layer 2102 may be formed by way of an ALD process, a CVD process, or a PVD process.

FIGS. 22A-22B illustrate cross-sectional views showing some embodiments of different patterning processes that may be used to pattern the upper conductive electrode layer (2102 of FIG. 21), the one or more dielectric layers (2002 of FIG. 21), and the lower conductive electrode layer (1902 of FIG. 21) to define a MIM capacitor 114.

In some embodiments, shown in cross-sectional view 2200 of FIG. 22A, a second patterned masking layer 2202 is formed on the upper conductive electrode layer (2102 of FIG. 21). A second etching process is performed on the upper conductive electrode layer (2102 of FIG. 21) according to the second patterned masking layer 2202 to remove the upper conductive electrode layer (2102 of FIG. 21) in areas not covered by the second patterned masking layer 2202 and define an upper conductive electrode 120. In some embodiments, the second etching process may be performed by exposing the upper conductive electrode layer (2102 of FIG. 21) to one or more second etchants 2204 in areas not covered by the second patterned masking layer 2202. In some embodiments, the second patterned masking layer 2202 may comprise photoresist.

As shown in cross-sectional view 2206, a third patterned masking layer 2208 is subsequently formed onto the upper conductive electrode 120 and the one or more dielectric layers (2002 of cross-sectional view 2200). A third etching process is then performed on the one or more dielectric layers (2002 of cross-sectional view 2200) and the lower conductive electrode layer (1902 of cross-sectional view 2200) according to the third patterned masking layer 2208 to define a capacitor dielectric structure 118 and a lower conductive electrode 116. The third etching process removes the one or more dielectric layers (2002 of cross-sectional view 2200) and the lower conductive electrode layer (1902 of cross-sectional view 2200) in areas not covered by the third patterned masking layer 2208. In some embodiments, the third etching process may be performed by exposing the one or more dielectric layers (2002 of cross-sectional view 2200) and the lower conductive electrode layer (1902 of cross-sectional view 2200) to one or more third etchants 2210 in areas not covered by the third patterned masking layer 2208. In some embodiments, the third patterned masking layer 2208 may comprise photoresist.

In some alternative embodiments, shown in cross-sectional view 2212 of FIG. 22B, a fourth patterned masking layer 2214 is formed on the upper conductive electrode layer (2102 of FIG. 21). A fourth etching process is performed on the upper conductive electrode layer (2102 of FIG. 21), the one or more dielectric layers (2002 of FIG. 21), and the lower conductive electrode layer (1902 of FIG. 21) according to the fourth patterned masking layer 2214. The fourth etching process defines an upper conductive electrode 120, a capacitor dielectric structure 118, and a lower conductive electrode 116. In some embodiments, the fourth etching process may be performed by exposing upper conductive electrode layer (2102 of FIG. 21), the one or more dielectric layers (2002 of FIG. 21), and the lower conductive electrode layer (1902 of FIG. 21) to one or more fourth etchants 2216 in areas not covered by the fourth patterned masking layer 2214. In some embodiments, the fourth patterned masking layer 2214 may comprise photoresist.

Figure 23:
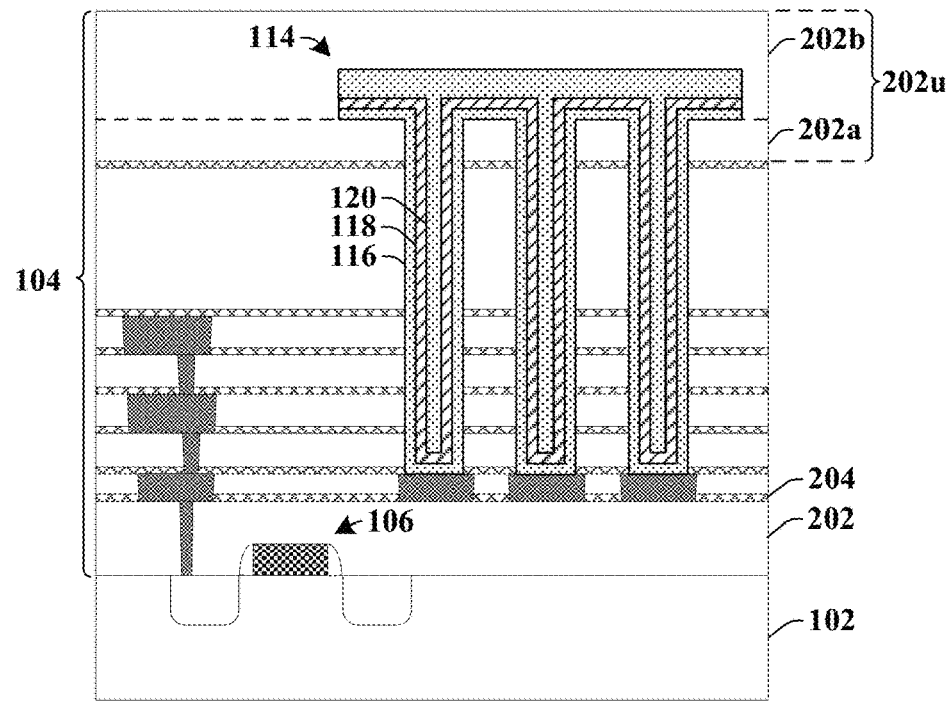

As shown in cross-sectional view 2300 of FIG. 23, a second ILD layer 202b is formed over the second dielectric structure (1702 of FIG. 22A) to define a dielectric structure 104. In some embodiments, the second ILD layer 202b may comprise a same material as an underlying first ILD layer 202a. The first ILD layer 202a and the second ILD layer 202b form an upper ILD layer 202u that continuously extends from below the MIM capacitor 114 to over the MIM capacitor 114. In various embodiments, the second ILD layer 202b may comprise a dielectric material, such as an oxide, a nitride, or the like. In some embodiments, the second ILD layer 202b may be formed by way of an ALD process, a CVD process, or a PVD process.

Figure 24:
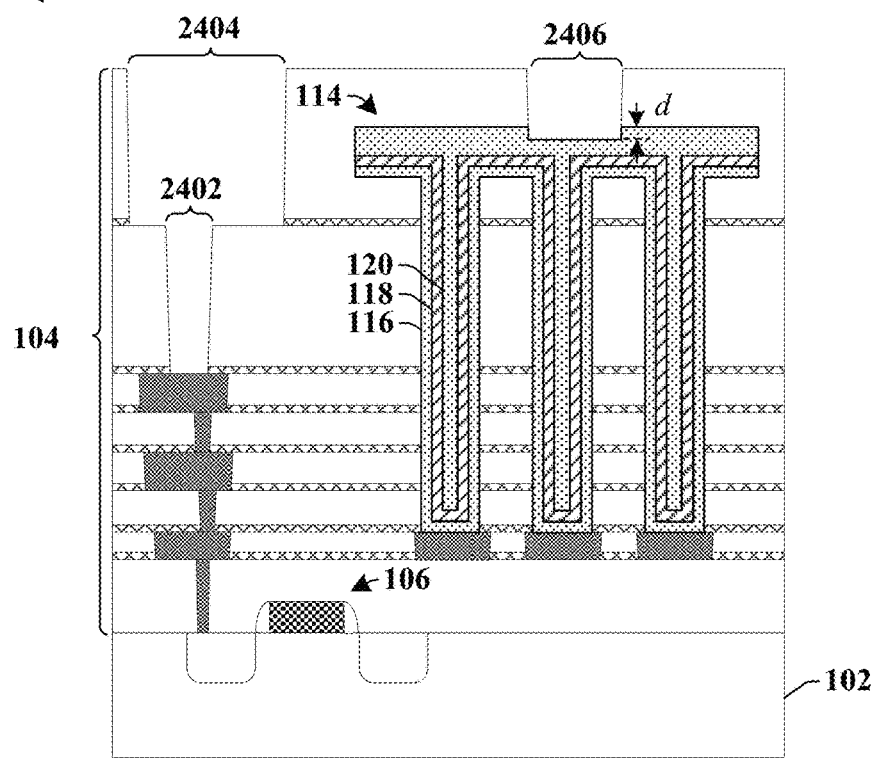

As shown in cross-sectional view 2400 of FIG. 24, a fifth etching process is performed on the dielectric structure 104. The fifth etching process defines a via hole 2402 and an interconnect wire trench 2404, which vertically extend from a top surface of the dielectric structure 104 to a position that is below a top of the MIM capacitor 114. The fifth etching process further defines an upper interconnect layer opening 2406 directly over the MIM capacitor 114. In some embodiments, the upper interconnect layer opening 2406 may extend a distance d below a top surface of the MIM capacitor 114 (e.g., a top surface of the upper conductive electrode 120). In such embodiments, the upper interconnect layer opening 2406 may be defined by sidewalls of both the dielectric structure 104 and the upper conductive electrode 120. In some embodiments, the fifth etching process may be performed by selectively exposing the dielectric structure 104 to a fifth etchant according to a fifth patterned masking layer.

Figure 25:
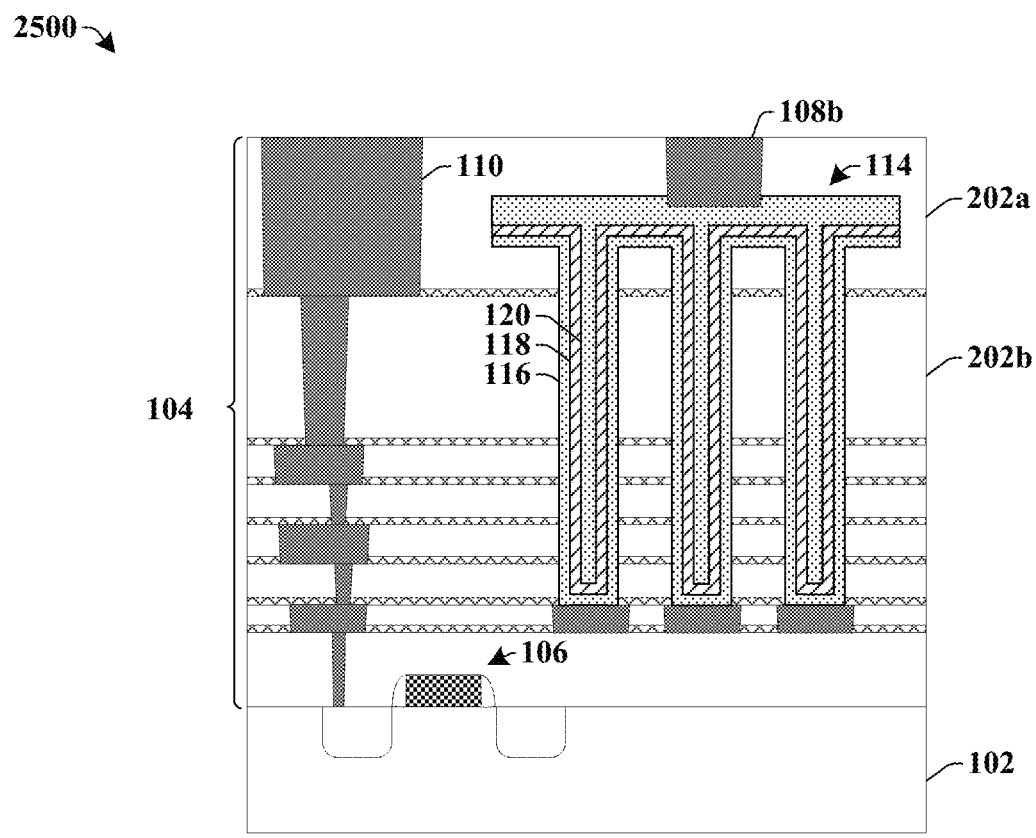

As shown in cross-sectional view 2500 of FIG. 25, one or more conductive materials are formed within the via hole (e.g., 2402 of FIG. 24), the interconnect wire trench (e.g., 2404 of FIG. 24), and the upper interconnect layer opening (e.g., 2406 of FIG. 24). In some embodiments, the one or more conductive materials may be formed using a deposition process and/or a plating process (e.g., electroplating, electro-less plating, etc.). In various embodiments, the one or more conductive materials may comprise tungsten, copper, aluminum, or the like. In some embodiments, a planarization process (e.g., a chemical mechanical planarization (CMP) process) may be performed after forming the one or more conductive materials to remove excess of the one or more conductive materials from over the dielectric structure 104 and to define an interconnect wire 110 and an upper interconnect layer 108b.

Figure 26:
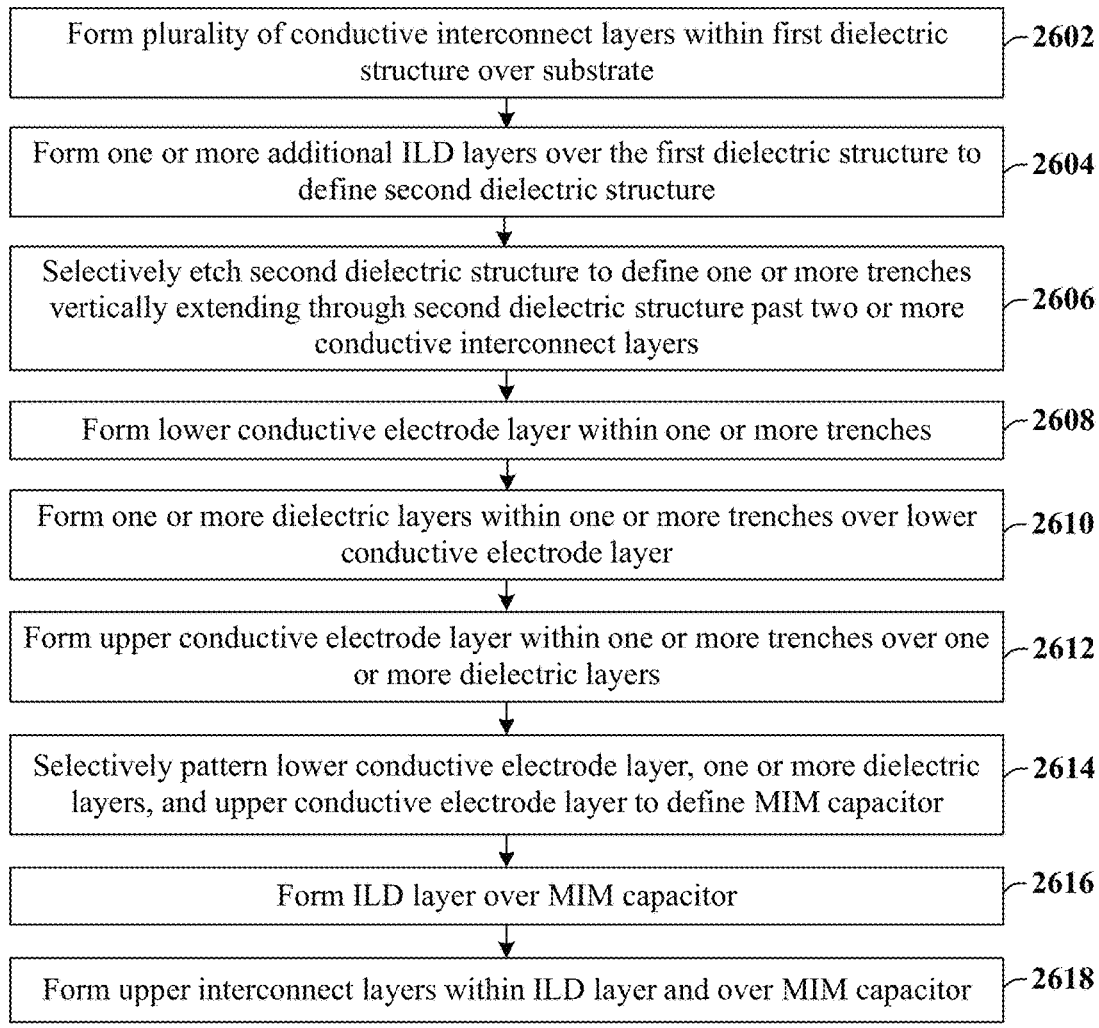
FIG. 26 illustrates a flow diagram of some embodiments of a method of forming an integrated chip having a high density MIM capacitor that vertically extends over a plurality of conductive interconnect layers.

FIG. 26 illustrates a flow diagram of some embodiments of a method 2600 of forming an integrated chip having a high density MIM capacitor vertically extending over a plurality of conductive interconnect layers.

While method 2600 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2602, a plurality of conductive interconnect layers are formed within a first dielectric structure over a substrate. FIG. 16 illustrates a cross-sectional view 1600 of some embodiments corresponding to act 2602.

At 2604, one or more additional ILD layers are formed over the first dielectric structure to define a second dielectric structure. FIG. 17 illustrates a cross-sectional view 1700 of some embodiments corresponding to act 2604.

At 2606, the second dielectric structure is selectively etched to define one or more trenches that vertically extend through the second dielectric structure past two or more conductive interconnect layers. FIG. 18 illustrates a cross-sectional view 1800 of some embodiments corresponding to act 2606.

At 2608, a lower conductive electrode layer is formed within the one or more trenches. FIG. 19 illustrates a cross-sectional view 1900 of some embodiments corresponding to act 2608.

At 2610, one or more dielectric layers are formed within the one or more trenches over the lower conductive electrode layer. FIG. 20 illustrates a cross-sectional view 2000 of some embodiments corresponding to act 2610.

At 2612, an upper conductive electrode layer is formed within the one or more trenches over the one or more dielectric layers. FIG. 21 illustrates a cross-sectional view 2100 of some embodiments corresponding to act 2612.

At 2614, the lower conductive electrode layer, the one or more dielectric layers, and the upper conductive electrode layer are selectively etched to define a MIM capacitor. FIG. 22A illustrates a cross-sectional view 2200 of some embodiments corresponding to act 2614. FIG. 22B illustrates a cross-sectional view 2200 of some alternative embodiments corresponding to act 2614.

At 2616, an ILD layer is formed over the MIM capacitor. FIG. 23 illustrates a cross-sectional view 2300 of some alternative embodiments corresponding to act 2616.

At 2618, upper interconnect layers are formed within the ILD layer at locations laterally adjacent to the MIM capacitor and vertically over the MIM capacitor. FIGS. 24-25 illustrate cross-sectional views 2400-2500 of some alternative embodiments corresponding to act 2618.

Accordingly, in some embodiments, the present disclosure relates to a high density MIM (metal-insulator-metal) capacitor that vertically extends over a plurality of conductive interconnect layers to provide for a high capacitance over a relatively small area.

In some embodiments, the present disclosure relates to an integrated chip. The integrated chip includes a dielectric structure disposed over a substrate; a plurality of conductive interconnect layers disposed within the dielectric structure, the plurality of conductive interconnect layers including alternating layers of interconnect wires and interconnect vias; and a metal-insulating-metal (MIM) capacitor arranged within the dielectric structure and having a lower conductive electrode separated from an upper conductive electrode by a capacitor dielectric structure, the MIM capacitor vertically extending past two or more of the plurality of conductive interconnect layers. In some embodiments, the lower conductive electrode has sidewalls vertically extending between a bottommost surface of the lower conductive electrode and a lower surface of the lower conductive electrode that faces the substrate. In some embodiments, the lower surface of the lower conductive electrode is separated from a closest underlying etch stop layer by a non-zero distance. In some embodiments, the dielectric structure includes an inter-level dielectric (ILD) layer that continuously extends from directly below the lower surface to directly above the upper conductive electrode. In some embodiments, the lower conductive electrode protrudes downward from a bottom surface of an ILD layer laterally surrounding the MIM capacitor. In some embodiments, a horizontal plane that is parallel to an upper surface of the substrate extends along a bottom of one of the plurality of conductive interconnect layers and through a sidewall of the MIM capacitor. In some embodiments, the dielectric structure includes a plurality of stacked inter-level dielectric (ILD) layers vertically separated by a plurality of etch stop layers; and the MIM capacitor vertically extends through at least two of the plurality of etch stop layers. In some embodiments, the integrated chip further includes an upper conductive interconnect layer contacting the upper conductive electrode, the upper conductive interconnect layer extending below a top surface of the upper conductive electrode by a non-zero distance. In some embodiments, the lower conductive electrode has a sidewall that contacts sidewalls of both the substrate and the dielectric structure. In some embodiments, the lower conductive electrode includes a plurality of sidewalls extending outward from a lower surface of the lower conductive electrode, the plurality of sidewalls having different lengths.

In other embodiments, the present disclosure relates to an integrated chip. The integrated chip includes a dielectric structure arranged over a substrate, the dielectric structure including a plurality of stacked inter-level dielectric (ILD) layers separated by a plurality of etch stop layers; a plurality of conductive interconnect layers arranged within the dielectric structure; a lower conductive electrode having first sidewalls coupled to a first bottom surface of the lower conductive electrode; and an upper conductive electrode separated from the lower conductive electrode by a capacitor dielectric structure and having second sidewalls coupled to a second bottom surface of the upper conductive electrode over the first bottom surface of the lower conductive electrode, the first sidewalls and the second sidewalls vertically extending through at least two of the plurality of etch stop layers. In some embodiments, the capacitor dielectric structure separates the lower conductive electrode from the upper conductive electrode along a first direction and along a second direction that is perpendicular to the first direction. In some embodiments, the upper conductive electrode has a greater height than the lower conductive electrode. In some embodiments, the plurality of stacked ILD layers include a first ILD layer laterally surrounding the lower conductive electrode, the lower conductive electrode protruding outward from a bottom surface of the first ILD layer. In some embodiments, the upper conductive electrode has a bottom surface that is below a top surface of the lower conductive electrode. In some embodiments, the upper conductive electrode has a plurality of protrusions extending outward from a lower surface that continuously extends around the plurality of protrusions.

In yet other embodiments, the present disclosure relates to a method of forming an integrated chip. The method includes forming a plurality of conductive interconnect layers within a dielectric structure over a substrate, the dielectric structure including a plurality of stacked inter-level dielectric (ILD) layers separated by a plurality of etch stop layers; etching the dielectric structure to define a trench that vertically extends through at least two of the plurality of etch stop layers; depositing a lower conductive electrode layer within the trench, one or more dielectric layers over the lower conductive electrode layer and within the trench, and an upper conductive electrode layer over the one or more dielectric layers and within the trench; and etching the lower conductive electrode layer, the one or more dielectric layers, and the upper conductive electrode layer to define a MIM (metal-insulator-metal) capacitor. In some embodiments, the method further includes forming an upper ILD layer over the MIM capacitor and the dielectric structure; selectively etching the upper ILD layer to form an interconnect wire trench that is laterally separated from the MIM capacitor by the upper ILD layer; and forming an interconnect wire in the interconnect wire trench. In some embodiments, the method further includes selectively etching the dielectric structure to form a via hole extending outward from a bottom of the interconnect wire trench; and forming a conductive material within the via hole and the interconnect wire trench to form an interconnect via and the interconnect wire. In some embodiments, the upper conductive electrode layer is etched according to a first etching process; and the lower conductive electrode layer and the one or more dielectric layers are etched according to a second etching process that is separate from the first etching process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
a dielectric structure disposed over a substrate;
a plurality of conductive interconnect layers disposed within the dielectric structure, wherein the plurality of conductive interconnect layers comprise alternating layers of interconnect wires and interconnect vias;
a metal-insulating-metal (MIM) capacitor arranged within the dielectric structure and comprising a lower conductive electrode separated from an upper conductive electrode by a capacitor dielectric structure, wherein the MIM capacitor has sidewalls defining three protrusions that vertically extend outward from a lower surface of the MIM capacitor to past two or more of the plurality of conductive interconnect layers; and
wherein a horizontal plane that is parallel to an upper surface of the substrate extends along the lower surface of the MIM capacitor and intersects a sidewall of a first interconnect of the plurality of conductive interconnect layers at a point that is separated from a top and a bottom of the first interconnect.

2. The integrated chip of claim 1, wherein the lower conductive electrode has sidewalls vertically extending between a bottommost surface of the lower conductive electrode and a lower surface of the lower conductive electrode that faces the substrate.

3. The integrated chip of claim 2, further comprising:
a first via contacting an upper surface of the upper conductive electrode; and
an upper ILD layer laterally surrounding the first via, wherein the upper ILD layer continuously extends from along a sidewall of the first via to vertically between the lower surface of the lower conductive electrode and an upper surface of a closest underlying etch stop layer.

4. The integrated chip of claim 1, wherein the lower conductive electrode protrudes downward from a bottom surface of an ILD layer laterally surrounding the MIM capacitor.

5. The integrated chip of claim 1,
wherein the dielectric structure comprises a plurality of stacked inter-level dielectric (ILD) layers vertically separated by a plurality of etch stop layers; and
wherein the MIM capacitor vertically extends through at least two of the plurality of etch stop layers.

6. The integrated chip of claim 1, further comprising:
an upper conductive interconnect layer contacting the upper conductive electrode, wherein the upper conductive interconnect layer extends below a top surface of the upper conductive electrode by a non-zero distance, and wherein a bottommost surface of the upper conductive interconnect layer is vertically separated from the capacitor dielectric structure by the upper conductive electrode.

7. An integrated chip, comprising:
a dielectric structure arranged over a substrate, wherein the dielectric structure comprises a plurality of stacked inter-level dielectric (ILD) layers separated by a plurality of etch stop layers;
a plurality of conductive interconnect layers arranged within the dielectric structure;
a lower conductive electrode having first sidewalls coupled between a first bottommost surface of the lower conductive electrode and a lower surface of the lower conductive electrode facing the substrate;
an upper conductive electrode separated from the lower conductive electrode by a capacitor dielectric structure and having second sidewalls coupled to a second bottommost surface of the upper conductive electrode over the first bottommost surface of the lower conductive electrode, wherein the first sidewalls and the second sidewalls vertically extend through at least two of the plurality of etch stop layers; and
an upper ILD layer laterally surrounding outermost sidewalls of the upper conductive electrode, wherein the upper ILD layer is directly and vertically between the lower surface of the lower conductive electrode and an upper surface of an underlying etch stop layer that is a closest etch stop layer to the lower surface.

8. The integrated chip of claim 7, wherein the capacitor dielectric structure separates the lower conductive electrode from the upper conductive electrode along a first direction and along a second direction that is perpendicular to the first direction.

9. The integrated chip of claim 7,
wherein the capacitor dielectric structure has third sidewalls that define a recess between the first sidewalls and the second sidewalls; and
wherein the upper conductive electrode completely fills the recess.

10. The integrated chip of claim 7, wherein the plurality of stacked ILD layers comprise:
a first ILD layer laterally surrounding the lower conductive electrode, the lower conductive electrode protruding outward from a bottom surface of the first ILD layer.

11. The integrated chip of claim 7, wherein the second bottommost surface of the upper conductive electrode is below a top surface of the lower conductive electrode.

12. The integrated chip of claim 7, wherein the upper conductive electrode has a plurality of protrusions extending outward from the lower surface that continuously extends around the plurality of protrusions.

13. The integrated chip of claim 7, wherein the first sidewalls continuously extend from directly and laterally between sidewalls of the upper ILD layer and to below the upper ILD layer.

14. The integrated chip of claim 7, wherein the first sidewalls extend through a part, but not all, of the upper ILD layer.

15. An integrated chip, comprising:
- a dielectric structure over a substrate, wherein the dielectric structure comprises a plurality of stacked inter-level dielectric (ILD) layers separated by a plurality of etch stop layers;
- a lower electrode vertically extending through two or more of the plurality of etch stop layers;
- a capacitor dielectric structure disposed on the lower electrode and contacting one or more horizontally extending surfaces and interior sidewalls of the lower electrode;
- an upper electrode disposed on the capacitor dielectric structure and contacting one or more horizontally extending surfaces and interior sidewalls of the capacitor dielectric structure, wherein the upper electrode comprises sidewalls extending outward from a lower surface of the upper electrode to define one or more protrusions extending away from the lower surface and towards the substrate, and wherein the lower surface of the upper electrode continuously wraps around the one or more protrusions in a closed loop;
- a first interconnect disposed within an upper ILD layer and contacting an upper surface of the upper electrode;
- a second interconnect disposed within the upper ILD layer and laterally separated from the upper electrode by the upper ILD layer, the second interconnect extending from within the upper ILD layer to a bottommost surface of the upper ILD layer; and
- wherein the upper ILD layer continuously extends from a sidewall of the first interconnect to vertically between the substrate and a lower surface of the lower electrode facing the substrate.

16. The integrated chip of claim 15,
- wherein the lower electrode has a lower outer sidewall below a first horizontally extending surface of the lower electrode and an upper outer sidewall above the first horizontally extending surface of the lower electrode;
- wherein the lower outer sidewall is tapered so that a first width of the lower electrode decreases as a first distance below the first horizontally extending surface increases; and
- wherein the upper outer sidewall is tapered so that a second width of the lower electrode decreases as a second distance above the first horizontally extending surface increases.

17. The integrated chip of claim 15,
- wherein the lower electrode completely covers opposing outermost sidewalls of the capacitor dielectric structure; and
- wherein the capacitor dielectric structure completely covers opposing outermost sidewalls of the upper electrode.

18. The integrated chip of claim 15, further comprising:
- a barrier layer laterally disposed between the lower electrode and the dielectric structure, wherein the barrier layer continuously extends from below a bottommost surface of the lower electrode to a topmost surface of the lower electrode.

19. The integrated chip of claim 15, wherein the lower electrode comprises a plurality of protrusions extending outward from the lower surface of the lower electrode, wherein the lower surface of the lower electrode extends past the plurality of protrusions along a first direction and along a second direction that is perpendicular to the first direction.

20. The integrated chip of claim 15,
- wherein the lower electrode has sidewalls defining one or more protrusions that vertically extend outward from the lower surface of the lower electrode, the lower surface being separated from the substrate by a first distance; and
- wherein the second interconnect has a bottommost surface that is separated from the substrate by a second distance that is greater than the first distance.

* * * * *